(12) United States Patent
Wu et al.

(10) Patent No.: US 12,095,432 B2
(45) Date of Patent: Sep. 17, 2024

(54) POWER NOISE SUPPRESSION CIRCUIT

(71) Applicant: NATIONAL TAIWAN UNIVERSITY, Taipei (TW)

(72) Inventors: Tzong-Lin Wu, Taipei (TW); Li-Ching Huang, Taipei (TW)

(73) Assignee: National Taiwan University, Taipei (TW)

( * ) Notice: Subject to any disclaimer, the term of this patent is extended or adjusted under 35 U.S.C. 154(b) by 482 days.

(21) Appl. No.: 17/457,511

(22) Filed: Dec. 3, 2021

(65) Prior Publication Data

US 2022/0385257 A1    Dec. 1, 2022

(30) Foreign Application Priority Data

Jun. 1, 2021    (TW) .................. 110119901

(51) Int. Cl.
    H03H 1/00    (2006.01)
    H02M 1/14    (2006.01)
    H03H 7/00    (2006.01)
    H03H 7/42    (2006.01)
    H04B 15/02   (2006.01)

(52) U.S. Cl.
    CPC .......... H03H 1/0007 (2013.01); H02M 1/143 (2013.01); H03H 7/427 (2013.01); H04B 15/02 (2013.01)

(58) Field of Classification Search
    CPC ...... H03H 7/427; H03H 1/0007; H04B 15/02; H02M 1/143
    USPC .................................... 333/181, 185
    See application file for complete search history.

(56) References Cited

U.S. PATENT DOCUMENTS 5,576,673 A * 11/1996 Asija .................. H01P 1/202
                                                333/175

* cited by examiner

*Primary Examiner* — Rakesh B Patel
(74) *Attorney, Agent, or Firm* — Rosenberg, Klein & Lee

(57) ABSTRACT

The invention discloses a power noise suppression circuit applied to a power system. The power noise suppression circuit comprises at least one power noise to heat converter and at least one anti-power noise transmitted unit. When a power noise within a specific frequency band enters the power noise suppression circuit, the power noise to heat converter converts the power noise to a thermal energy, and the anti-power noise transmitted unit reflects the power noise within the specific frequency band to the power noise to heat converter. Accordingly, the power noise within the specific frequency band can be suppressed and absorbed in the power noise suppression circuit, so as to maintain the stability of the power system.

18 Claims, 21 Drawing Sheets

POWER NOISE SUPPRESSION CIRCUIT

This non-provisional application claims priority claim under 35 U.S.C. § 119(a) on Taiwan Patent Application No. 110119901 filed Jun. 1, 2021, the entire contents of which are incorporated herein by reference.

FIELD OF THE INVENTION

The present invention is related to a noise suppression circuit, particularly to a suppression circuit used for eliminating power noises.

BACKGROUND

In recent years, the advance of integrated circuit technology has driven higher data transfer rate. However, severe electromagnetic noises are generated during the operation of the high-speed circuits due to some non-ideal effects, such as trace inductance, high-frequency metal loss, or via discontinuities, etc. Such electromagnetic noises may couple to signal traces and increase bit error rates. Furthermore, these noises may radiate and affect the operation of nearby antennas and communication modules.

In general, the electromagnetic noises can be mainly categorized into two types: common-mode noises, and power noises. The applicant of the present disclosure previously filed a patent related to noise suppression, such as Taiwan Patent Publication (No. TW201818596A), which discloses a common-mode signal absorber. The common-mode signal absorber includes a circuit board that has an upper surface with a pair of narrow traces, and that has a lower surface with a mushroom-like structure or a defected-ground structure. The narrow traces may serve as a pair of signal transmission lines for transmitting differential signals. The mushroom-like structure or the defected-ground structure forms a resonant cavity in a symmetric surface to suppress the common-mode signals. However, such common-mode signal absorber is only applicable to suppress the common-mode signals. It is not suitable to suppress power noises in a power system. The reason is described as follows: in order to avoid energy loss and transmit large DC currents (e.g. tens to hundreds of amperes for a high-performance laptop) from power supply to operating load circuits, power systems are usually required low DC resistance (e.g. under 0.1~10 ohms). If the narrow traces of the common-mode signal absorber are adopted as the metal conductors for transmitting DC power, the narrow traces with higher DC resistance will cause large power loss and large DC voltage drops. Furthermore, the narrow traces with higher inductance would also cause significant voltage ripples for power systems. Therefore, most of modern electronic products employ power/ground planes or relatively wide power rails as the power systems. The characteristic impedance of such wider power systems is usually below 20 ohm, which is lower than the characteristic impedance of the narrow signal traces (e.g. 50 ohm). The above-mentioned two reasons clarify the difference between a common-mode signal absorber and a power noise suppression circuit of the present invention.

A most common method for suppressing power noises is adding various decoupling capacitors to a power plane, a power rail, or a power trace of the circuit board, wherein the decoupling capacitors can provide in-time charges and low-impedance paths. However, such low-impedance paths may cause multiple reflections in the circuit board, generate significant power noises at the reflective ends of the power system, and even further cause electromagnetic interference (EMI) problems. Therefore, it is essential to maintain the stability of the power system and avoid the generation of excessive power noises in a high-speed system.

SUMMARY

It is one objective of the present invention to provide a power noise suppression circuit, which is disposed in a power system, and comprises at least one power noise to heat converter and at least one anti-power noise transmitted unit. The power noise to heat converter comprises an impedance unit. When at least one power noise within at least one specific frequency band enters the power noise suppression circuit, the power noise to heat converter converts the power noise to a thermal energy by the impedance unit, and the anti-power noise transmitted unit reflects the power noise within the specific frequency band to the power noise to heat converter. Thus, the power noise within the specific frequency band can be absorbed in the power noise suppression circuit, so as to maintain the stability of the power system.

It is other objective of the present invention to provide a power noise suppression circuit, wherein when the unabsorbed power noise within specific frequency band inputs to the anti-power noise transmitted unit through the power noise to heat converter, the anti-power noise transmitted unit reflects the unabsorbed power noise within the specific frequency band back to the power noise to heat converter so that the impedance unit of the power noise to heat converter absorbs the power noise within specific frequency band again.

It is another objective of the present invention to provide a power noise suppression circuit, wherein the anti-power noise transmitted unit is provided at one side thereof with one power noise to heat converter, and provided at other side thereof with the other power noise to heat converter. Thus, the anti-power noise transmitted unit is provided on both sides thereof with the power noise to heat converters to achieve the effect of bidirectional absorption of the power noises.

For achieving the above objectives, the present invention provides a power noise suppression circuit, which is applied to a power system, comprising: at least one first power noise to heat converter comprising at least one first impedance unit; and at least one anti-power noise transmitted unit connected to the at least one first power noise to heat converter; wherein when at least one power noise within at least one specific frequency band enters the power noise suppression circuit, the at least one first power noise to heat converter absorbs the at least one power noise within the at least one specific frequency band by the at least one first impedance unit so as to convert the at least one power noise within at least one specific frequency band to a thermal energy, and the at least one anti-power noise transmitted unit reflects the at least one power noise within at least one specific frequency band to the at least one first power noise to heat converter.

In one embodiment of the present invention, when the unabsorbed at least one power noise within at least one specific frequency band inputs to the at least one anti-power noise transmitted unit through the at least one first power noise to heat converter, the at least one anti-power noise transmitted unit reflects the at least one power noise within at least one specific frequency band back to the at least one first power noise to heat converter so that the at least one first impedance unit of the at least one first power noise to heat converter absorbs the at least one power noise within at least one specific frequency band again.

In one embodiment of the present invention, wherein the at least one first power noise to heat converter and the at least one anti-power noise transmitted unit can withstand a large DC current provided by the power system for an operating load circuit such that a DC power of the power system can pass through the at least one first power noise to heat converter and the at least one anti-power noise transmitted unit with a low energy loss.

In one embodiment of the present invention, wherein the power noise suppression circuit is usually placed in a low-impedance power system, and characteristic impedance of such low-impedance power system is usually below 20 ohm.

In one embodiment of the present invention, wherein the power noise suppression circuit which is measured under a specific low-impedance environment below 50 ohm has an absorption rate above 50% for the at least one power noise within the at least one specific frequency band.

In one embodiment of the present invention, wherein the power noise suppression circuit comprises a plurality of the first power noise to heat converters and a plurality of the anti-power noise transmitted units, each of the first power noise to heat converters absorbs the at least one power noise within the same or the different specific frequency bands, respectively, and each of the anti-power noise transmitted units reflects the at least one power noise within the same or the different specific frequency bands, respectively.

In one embodiment of the present invention, wherein the power noise suppression circuit further comprises at least one second power noise to heat converter; the at least one anti-power noise transmitted unit is configured between the at least one first power noise to heat converter and the at least one second power noise to heat converter, and the at least one second power noise to heat converter comprises at least one second impedance unit; when the at least one power noise within the at least one specific frequency band enters the power noise suppression circuit, the at least one first power noise to heat converter or the at least one second power noise to heat converter absorbs the at least one power noise within the at least one specific frequency band by the at least one first impedance unit or at least one second impedance unit so as to convert the at least one power noise within the at least one specific frequency band to the thermal energy, and the at least one anti-power noise transmitted unit reflects the at least one power noise within the at least one specific frequency band to the at least one first power noise to heat converter or the at least one second power noise to heat converter.

In one embodiment of the present invention, wherein the power noise suppression circuit comprises a plurality of the first power noise to heat converters, a plurality of the anti-power noise transmitted units, and a plurality of the second power noise to heat converters, each of the first power noise to heat converters and each of the second power noise to heat converters absorb the at least one power noise within the same or the different specific frequency bands, respectively, and each of the anti-power noise transmitted units reflects the power noise with the same or the different specific frequency bands, respectively.

In one embodiment of the present invention, wherein the first power noise to heat converter comprises a first conductor connected to a power conductor, and a second conductor connected to a return path; a first equivalent circuit is equivalently formed between the first conductor and the second conductor of the first power noise to heat converter; the first equivalent circuit comprises at least one first capacitor, at least one first inductor, and at least one first resistor; the at least one first capacitor, the at least one first inductor, and the at least one first resistor are connected in series or in parallel.

In one embodiment of the present invention, wherein the anti-power noise transmitted unit comprises a first conductor connected to a power conductor, and a second conductor connected to a return path; a second equivalent circuit is equivalently formed between the first conductor and the second conductor of the anti-power noise transmitted unit; the second equivalent circuit comprises at least one second capacitor and at least one second inductor; the at least one second capacitor and the at least one second inductor are connected in series or in parallel.

In one embodiment of the present invention, wherein a structure of the power noise suppression circuit comprising: a first conductor connected to a power conductor, wherein a DC current transmitted on the power conductor will flow through the first conductor; the first conductor is provided at one side thereof with a first slot portion, and provided at other side thereof with a second slot portion; the first slot portion comprises a first metal block that is connected to the first conductor via the at least one first impedance unit, and the second slot portion comprises a second metal block that is directly connected to the first conductor; and a second conductor connected to a return path, wherein a return current transmitted on the return path will flow through the second conductor; a gap exists between the first conductor and the second conductor; wherein the first slot portion, the first metal block, the at least one first impedance unit, part of the first conductor around the first slot portion, and part of the second conductor corresponding to part of the first conductor around the first slot portion will be combined into the first power noise to heat converter; the second slot portion, the second metal block, part of the first conductor around the second slot portion, and part of the second conductor corresponding to part of the first conductor around the second slot portion will be combined into the anti-power noise transmitted unit.

In one embodiment of the present invention, wherein a structure of the power noise suppression circuit comprising: a first conductor connected to a return path, wherein a return current transmitted on the return path will flow through the first conductor; the first conductor is provided at one side thereof with a first slot portion, and provided at other side thereof with a second slot portion; the first slot portion comprises a first metal block that is connected to the first conductor via the at least one first impedance unit, and the second slot portion comprises a second metal block that is directly connected to the first conductor; and a second conductor connected to a power conductor, wherein a DC current transmitted on the power conductor will flow through the second conductor; a gap exists between the first conductor and the second conductor; wherein the first slot portion, the first metal block, the at least one first impedance unit, part of the first conductor around the first slot portion, and part of the second conductor corresponding to part of the first conductor around the first slot portion will be combined into the first power noise to heat converter; the second slot portion, the second metal block, part of the first conductor around the second slot portion, and part of the second conductor corresponding to part of the first conductor around the second slot portion will be combined into the anti-power noise transmitted unit.

In one embodiment of the present invention, wherein a structure of the power noise suppression circuit comprising:

a first conductor connected to a power conductor, wherein a DC current transmitted on the power conductor will flow through the first conductor; the first conductor comprises a first slot portion, a second slot portion, and a third slot portion; the first slot portion is provided at one side of the first conductor, the third slot portion is provided at other side of the first conductor, and the second slot portion is provided between the first slot portion and the third slot portion; the first slot portion comprises a first metal block that is connected to the first conductor via the at least one first impedance unit, the second slot portion comprises a second metal block that is directly connected to the first conductor, and the third slot portion is connected to the first conductor via the at least one second impedance unit; and a second conductor connected to a return path, wherein a return current transmitted on the return path will flow through the second conductor; a gap exists between the first conductor and the second conductor; wherein the first slot portion, the first metal block, the at least one first impedance unit, part of the first conductor around the first slot portion, and part of the second conductor corresponding to part of the first conductor around the first slot portion will be combined into the first power noise to heat converter; the second slot portion, the second metal block, part of the first conductor around the second slot portion, and part of the second conductor corresponding to part of the first conductor around the second slot portion will be combined into the anti-power noise transmitted unit; the third slot portion, the third metal block, the at least one second impedance unit, part of the first conductor around the third slot portion, and part of the second conductor corresponding to part of the first conductor around the third slot portion will be combined into the second power noise to heat converter.

In one embodiment of the present invention, wherein a structure of the power noise suppression circuit comprising: a first conductor connected to a return path, wherein a return current transmitted on the return path will flow through the first conductor; the first conductor comprises a first slot portion, a second slot portion, and a third slot portion; the first slot portion is provided at one side of the first conductor, the third slot portion is provided at other side of the first conductor, and the second slot portion is provided between the first slot portion and the third slot portion; the first slot portion comprises a first metal block that is connected to the first conductor via the at least one first impedance unit, the second slot portion comprises a second metal block that is directly connected to the first conductor, and the third slot portion is connected to the first conductor via the at least one second impedance unit; and a second conductor connected to a power conductor, wherein a DC current transmitted on the power conductor will flow through the second conductor; a gap exists between the first conductor and the second conductor; wherein the first slot portion, the first metal block, the at least one first impedance unit, part of the first conductor around the first slot portion, and part of the second conductor corresponding to part of the first conductor around the first slot portion will be combined into the first power noise to heat converter; the second slot portion, the second metal block, part of the first conductor around the second slot portion, and part of the second conductor corresponding to part of the first conductor around the second slot portion will be combined into the anti-power noise transmitted unit; the third slot portion, the third metal block, the at least one second impedance unit, part of the first conductor around the third slot portion, and part of the second conductor corresponding to part of the first conductor around the third slot portion will be combined into the second power noise to heat converter.

In one embodiment of the present invention, wherein a structure of the power noise suppression circuit comprising: a first conductor connected to a power conductor, wherein a DC current transmitted on the power conductor will flow through the first conductor; a second conductor, connected to a return path, and comprising a first slot portion; wherein a return current transmitted on the return path will flow through the second conductor; a gap exists between the first conductor and the second conductor; a first metal pad, wherein there is a gap between the first metal pad and the first conductor; a third conductor extended between the first metal pad and the first slot portion of the second conductor in a vertical direction or a horizontal direction, wherein the third conductor is connected at one end thereof to the first metal pad, and connected at other end thereof to the second conductor via the at least one first impedance unit; and a second metal pad, wherein there is a gap between the second metal pad and the first conductor, and the second metal pad is connected to the second conductor via a fourth conductor that is disposed in the vertical direction or the horizontal direction; wherein the first metal pad, the third conductor, the at least one first impedance unit, part of the second conductor around the first slot portion, and part of the first conductor corresponding to part of the second conductor around the first slot portion will be combined into the first power noise to heat converter; the second metal pad, the fourth conductor, part of the first conductor corresponding to the second metal pad, and part of the second conductor corresponding to the second metal pad will be combined into the anti-power noise transmitted unit.

In one embodiment of the present invention, wherein a structure of the power noise suppression circuit comprising: a first conductor connected to a return path, wherein a return current transmitted on the return path will flow through the first conductor; a second conductor, connected to a power conductor, and comprising a first slot portion; wherein a DC current transmitted on the power conductor will flow through the second conductor; a gap exists between the first conductor and the second conductor; a first metal pad, wherein there is a gap between the first metal pad and the first conductor; a third conductor extended between the first metal pad and the first slot portion of the second conductor in a vertical direction or a horizontal direction, wherein the third conductor is connected at one end thereof to the first metal pad, and connected at other end thereof to the second conductor via the at least one first impedance unit; and a second metal pad, wherein there is a gap between the second metal pad and the first conductor, and the second metal pad is connected to the second conductor via a fourth conductor that is disposed in the vertical direction or the horizontal direction; wherein the first metal pad, the third conductor, the at least one first impedance unit, part of the second conductor around the first slot portion, and part of the first conductor corresponding to part of the second conductor around the first slot portion will be combined into the first power noise to heat converter; the second metal pad, the fourth conductor, part of the first conductor corresponding to the second metal pad, and part of the second conductor corresponding to the second metal pad will be combined into the anti-power noise transmitted unit.

In one embodiment of the present invention, wherein a structure of the power noise suppression circuit comprising: a first conductor connected to a power conductor, wherein a DC current transmitted on the power conductor will flow through the first conductor; a second conductor, connected to a return path, and comprising a first slot portion and a second slot portion; wherein a return current transmitted on the return path will flow through the second conductor; a gap exists between the first conductor and the second conductor; a first metal pad, wherein there is a gap between the first metal pad and the first conductor; a third conductor extended between the first metal pad and the first slot portion of the second conductor in a vertical direction or a horizontal direction, wherein the third conductor is connected at one end thereof to the first metal pad, and connected at other end thereof to the second conductor via the at least one first impedance unit; a second metal pad, wherein there is a gap between the second metal pad and the first conductor, and the second metal pad is connected to the second conductor via a fourth conductor that is disposed in the vertical direction or the horizontal direction; a third metal pad, wherein there is a gap between the third metal pad and the first conductor; and the first metal pad and the third metal pad are located on two sides of the second metal pad; and a fifth conductor extended between the third metal pad and the second slot portion of the second conductor in the vertical direction or the horizontal direction, wherein the fifth conductor is connected at one end thereof to the third metal pad, and connected at other end thereof to the second conductor via the at least one second impedance unit; wherein the first metal pad, the third conductor, the at least one first impedance unit, part of the second conductor around the first slot portion, and part of the first conductor corresponding to part of the second conductor around the first slot portion will be combined into the first power noise to heat converter; the second metal pad, the fourth conductor, part of the first conductor corresponding to the second metal pad, and part of the second conductor corresponding to the second metal pad will be combined into the anti-power noise transmitted unit; the third metal pad, the fifth conductor, the at least one second impedance unit, part of the second conductor around the second slot portion, and part of the first conductor corresponding to the second conductor around the second slot portion will be combined into the second power noise to heat converter.

In one embodiment of the present invention, wherein a structure of the power noise suppression circuit comprising: a first conductor connected to a return path, wherein a return current transmitted on the return path will flow through the first conductor; a second conductor, connected to a power conductor, and comprising a first slot portion and a second slot portion; wherein a DC current transmitted on the power conductor will flow through the second conductor; a gap exists between the first conductor and the second conductor; a first metal pad, wherein there is a gap between the first metal pad and the first conductor; a third conductor extended between the first metal pad and the first slot portion of the second conductor in a vertical direction or a horizontal direction, wherein the third conductor is connected at one end thereof to the first metal pad, and connected at other end thereof to the second conductor via the at least one first impedance unit; a second metal pad, wherein there is a gap between the second metal pad and the first conductor, and the second metal pad is connected to the second conductor via a fourth conductor that is disposed in the vertical direction or the horizontal direction; a third metal pad, wherein there is a gap between the third metal pad and the first conductor; and the first metal pad and the third metal pad are located on two sides of the second metal pad; and a fifth conductor extended between the third metal pad and the second slot portion of the second conductor in the vertical direction or the horizontal direction, wherein the fifth conductor is connected at one end thereof to the third metal pad, and connected at other end thereof to the second conductor via the at least one second impedance unit; wherein the first metal pad, the third conductor, the at least one first impedance unit, part of the second conductor around the first slot portion, and part of the first conductor corresponding to part of the second conductor around the first slot portion will be combined into the first power noise to heat converter; the second metal pad, the fourth conductor, part of the first conductor corresponding to the second metal pad, and part of the second conductor corresponding to the second metal pad will be combined into the anti-power noise transmitted unit; the third metal pad, the fifth conductor, the at least one second impedance unit, part of the second conductor around the second slot portion, and part of the first conductor corresponding to part of the second conductor around the second slot portion will be combined into the second power noise to heat converter.

DETAILED DESCRIPTION OF THE PREFERRED EMBODIMENTS

Figure 1:
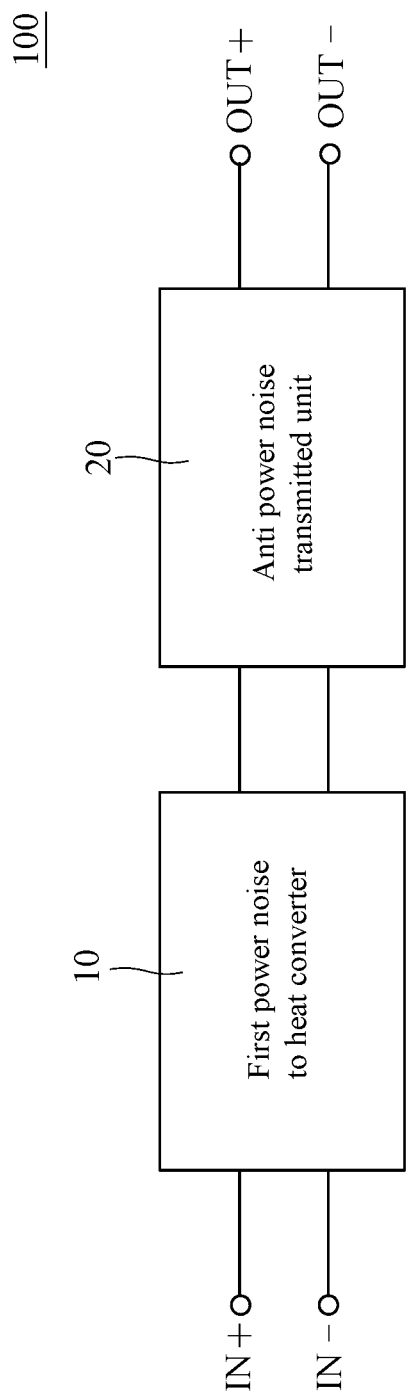
FIG. 1 is a circuit block diagram of a power noise suppression circuit according to one embodiment of the present invention.

Referring to FIG. 1, there is shown a circuit block diagram of a power noise suppression circuit according to one embodiment of the present invention. As shown in FIG. 1, the power noise suppression circuit 100 of the present invention is applied to a power system, and used to suppress power noises transmitted on a power conductor or a return path of the power system. The power noise suppression circuit 100 comprises at least one first power noise to heat converter 10 and at least one anti-power noise transmitted unit 20. The first power noise to heat converter 10 has a pair of input ends (IN+, IN−), and the anti-power noise transmitted unit 20 has a pair of output ends (OUT+, OUT−). A pair of input ends of the anti-power noise transmitted unit 20 are connected to a pair of output ends of the first power noise to heat converter 10. A DC power is inputted into the input ends (IN+, IN−) of the first power noise to heat converter 10, and outputted from the output ends (OUT+, OUT−) of the anti-power noise transmitted unit 20. Otherwise, the DC power is inputted into the anti-power noise transmitted unit 20, and outputted from the first power noise to heat converter 10. The first power noise to heat converter 10 and the anti-power noise transmitted unit 20 are required to withstand a large DC current provided by the power system for an operating load circuit such that the DC power of the power system can pass through the first power noise to heat converter 10 and the anti-power noise transmitted unit 20 with a low energy loss.

In general, narrow traces with higher DC resistance will cause larger energy loss. Besides, narrow traces with higher inductance will also cause significant voltage ripples. Therefore, most of modern electronic products employ power/ ground planes or relatively wide power rails as the power systems. The power noise suppression circuit 100 of the present invention is applied to such low-impedance power system whose characteristic impedance is usually below 20 ohm.

A most common method for suppressing power noises is adding various decoupling capacitors to the power system. However, this may generate significant power noises at the reflective ends of the power system, and even further cause electromagnetic interference (EMI) issues. The power noise suppression circuit 100 of the present invention can be disposed in the power system to suppress the excessive power noises so as to maintain the stability of the power system.

For the circuit design of the present invention, the anti-power noise transmitted unit 20 is designed to prohibit the power noises within at least one specific frequency band from transmitting. Then, the first power noise to heat converter 10 is designed based on the concept that input impedance of the power noise suppression circuit 100 from the first power noise to heat converter 10 direction is required to match to the power system within at least one specific frequency band so as to absorb and convert the power noises within at least one specific frequency band to heat. When the power noises within the specific frequency band enters the first power noise to heat converter 10, the first power noise to heat converter 10 absorbs the power noises within the specific frequency band by at least one lossy element (such as the first impedance unit 1112 in FIG. 2, or the first impedance unit 1412 in FIG. 4) to convert the power noises within the specific frequency band to a thermal energy. Besides, when the power noises within the specific frequency band is unabsorbed by the first power noise to heat converter 10 and inputted to the anti-power noise transmitted unit 20 through the first power noise to heat converter 10, the anti-power noise transmitted unit 20 will reflect the power noises within the specific frequency band back to the first power noise to heat converter 10 so that the first power noise to heat converter 10 absorbs the power noises within the specific frequency band again. Thus, the power noises within the specific frequency band is able to be repeatedly absorbed and reflected between the first power noise to heat converter 10 and the anti-power noise transmitted unit 20 until an energy of the power noises within the specific frequency band is completely consumed.

When the power noise suppression circuit 100 of the present invention is applied to an N-port power system, the absorption rate of the power noises viewed from the i-th port is defined as $(1-\Sigma_{j=1}^{N}|S_{ji}|^2) \times 100\%$. To exemplify by a two-port power system, the absorption rate of the power noises viewed from the first port is defined as $(1-|S_{11}|^2-|S_{21}|^2) \times 100\%$, on the other side, the absorption rate of the power noises viewed from the second port is defined as $(1-|S_{12}|^2-|S_{22}|^2) \times 100\%$. Also, according to the present invention, the absorption rate of the power noises is measured by placing the power noise suppression circuit 100 in a specific low-impedance environment below 50 ohm, a measured result therefrom shows that an absorption rate of the power noises within the specific frequency band is greater than 50%.

Figure 2:
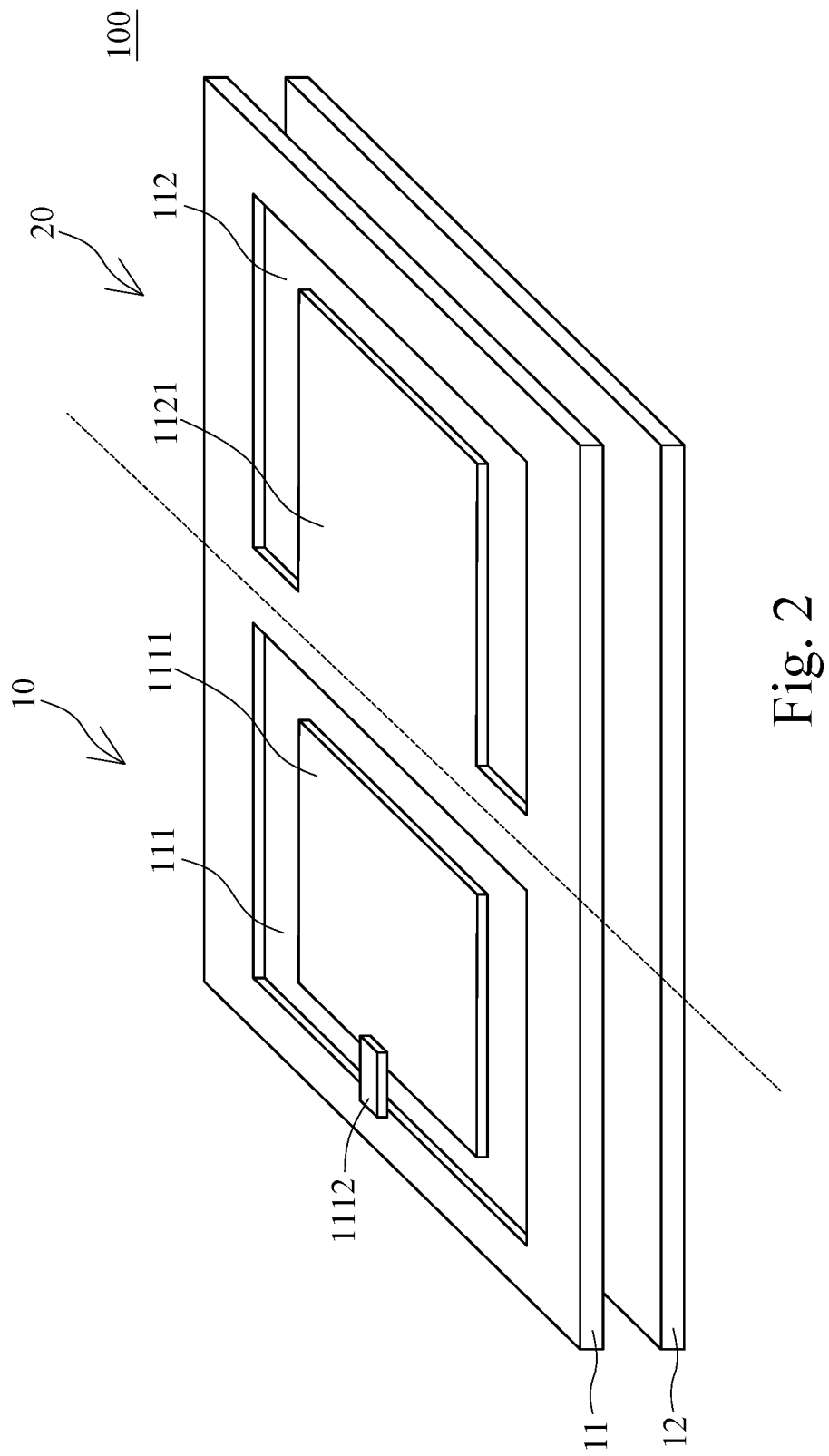
FIG. 2 is a three-dimensional structural view of the power noise suppression circuit according to one embodiment of the present invention.
Figure 3:
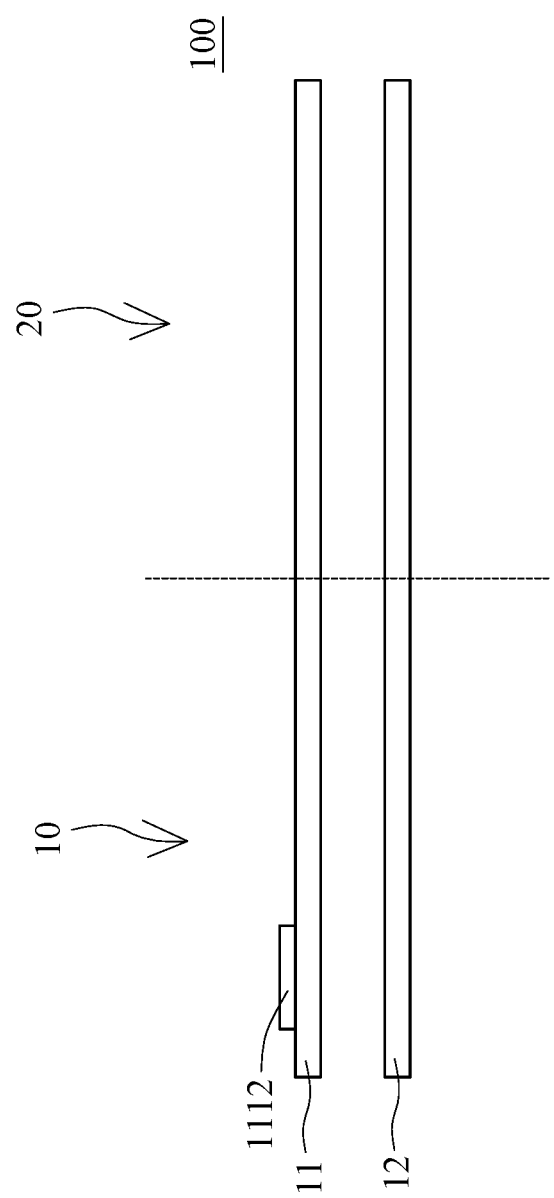
FIG. 3 is a structural cross-sectional view of the power noise suppression circuit according to one embodiment of the present invention.

Referring to FIG. 2 and FIG. 3, there are shown a three-dimensional structural view and a structural cross-sectional view of the power noise suppression circuit according to one embodiment of the present invention, and also referring to FIG. 1. As shown in FIGS. 1, 2, and 3, the power noise suppression circuit 100 can be implemented by a printed circuit board, and comprise a first conductor 11 and a second conductor 12. The first conductor 11 is provided at one side thereof with a first slot portion 111, and provided at other side thereof with a second slot portion 112. The first slot portion 111 comprises a first metal block 1111, and connected the first conductor 11 via at least one first impedance unit 1112. The second slot portion 112 comprises a second metal block 1121, and connected to the first conductor 11 directly. In the present invention, the first metal block 1111 and the second metal block 1121 can be square blocks, oval blocks, diamond blocks, or any other shape blocks.

The first slot portion 111, the first metal block 1111, the first impedance unit 1112, part of the first conductor 11 around the first slot portion 111, and part of the second conductor 12 corresponding to part of the first conductor 11 around the first slot portion 111 will be combined into the first power noise to heat converter 10. The second slot portion 112, the second metal block 1121, part of the first conductor 11 around the second slot portion 112, and part of the second conductor 12 corresponding to part of the first conductor 11 around the second slot portion 112 will be combined into the anti-power noise transmitted unit 20.

In one embodiment of the present invention, the first conductor 11 is connected to a power conductor, and the second conductor 12 is connected to a return path. A DC current transmitted on the power conductor will flow through the first conductor 11, and a return current transmitted on the return path will flow through the second conductor 12. In the present invention, the power conductor may be a power plane, a power rail, or a power trace, and the return path may be a reference potential or a grounded plane.

In other embodiment of the present invention, the first conductor 11 is connected to the return path, and the second conductor 12 is connected to the power conductor. The DC current transmitted on the power conductor will flow through the second conductor 12, and the return current transmitted on the return path will flow through the first conductor 11.

The structure of the power noise suppression circuit 100 is simulated by an equivalent circuit model. An inductor is equivalently formed by the first metal block 1111 and part of the first conductor 11 around the first slot portion 111, a capacitor is equivalently formed between the first metal block 1111 and the second conductor 12, and a resistor is equivalently formed by a first impedance unit 1112, such that an RLC equivalent resonance circuit will be equivalently formed from the structure of the first power noise to heat converter 10. Furthermore, an inductor is equivalently formed by the second metal block 1121 and part of the first conductor 11 around the second slot portion 112, and a capacitor is equivalently formed between the second metal block 1121 and the second conductor 12 such that an LC equivalent resonance circuit will be equivalently formed from the structure of the anti-power noise transmitted unit 20. The power noise suppression circuit 100 absorbs the power noises within the specific frequency band by the RLC equivalent resonance circuit equivalently formed from the structure of the first power noise to heat converter 10, and reflects the power noises within the specific frequency band by the LC equivalent resonance circuit equivalently formed from the structure of the anti-power noise transmitted unit 20.

Figure 4:
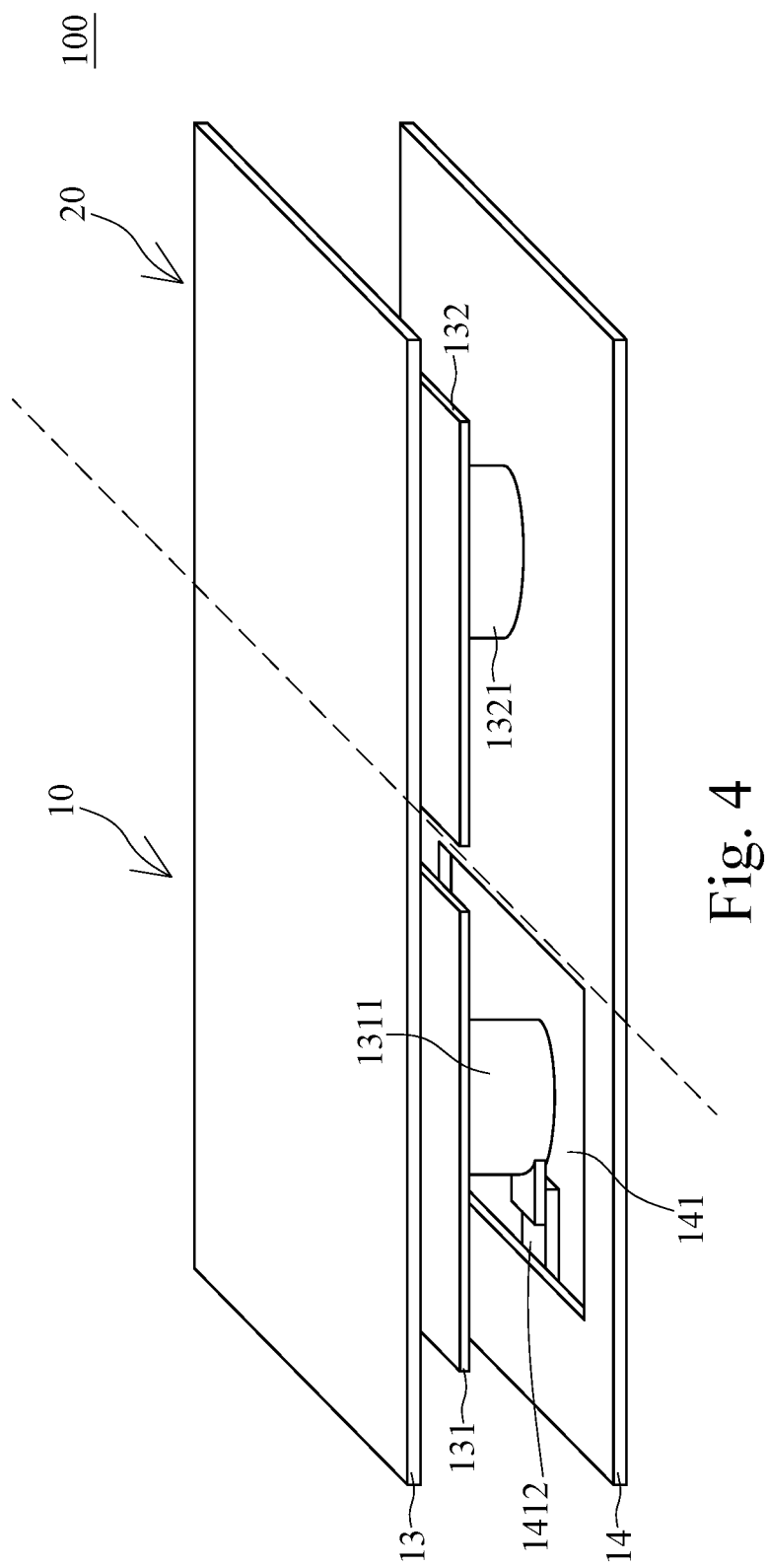
FIG. 4 is a three-dimensional structural view of the power noise suppression circuit according to other embodiment of the present invention.
Figure 5:
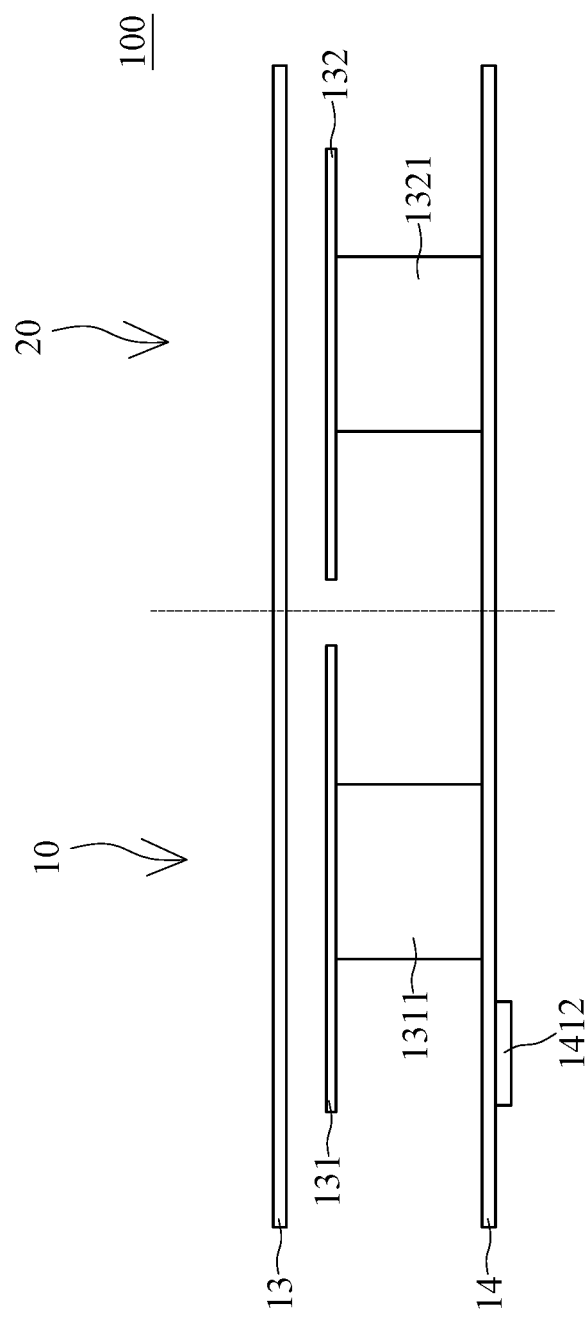
FIG. 5 is a structural cross-sectional view of the power noise suppression circuit according to other embodiment of the present invention.

Referring to FIG. 4 and FIG. 5, there are shown a three-dimensional structural view and a structural cross-sectional view of the power noise suppression circuit according to other embodiment of the present invention, and also referring to FIG. 1. As shown in FIGS. 1, 4, and 5, the power noise suppression circuit 100 can also be implemented by a printed circuit board, and comprises a first conductor 13 and a second conductor 14. A gap exists between the first conductor 13 and a second conductor 14. The second conductor 14 comprises a first slot portion 141.

There is a first metal pad 131 and a gap exists between the first metal pad 131 and the first conductor 13. A third conductor 1311 is extended between the first metal pad 131 and the first slot portion 141 of the second conductor 14 in a vertical direction or a horizontal direction. The third conductor 1311 is connected at one end thereof to the first metal pad 131, and connected at other end thereof to the second conductor 14 via a first impedance unit 1412. There is a second metal pad 132 and a gap exists between the second metal pad 132 and the first conductor 13. The second metal pad 132 is connected to the second conductor 14 via a fourth conductor 1321 that is disposed in a vertical direction or a horizontal direction.

The first metal pad 131, the third conductor 1311, the first impedance unit 1412, part of the second conductor 14 around the first slot portion 141, and part of the first conductor 13 corresponding to part of the second conductor 14 around the first slot portion 141 will be combined into the first power noise to heat converter 10. The second metal pad 132, the fourth conductor 1321, part of the first conductor 13 corresponding to the second metal pad 132, and part of the second conductor 14 corresponding to the second metal pad 132 will be combined into the anti-power noise transmitted unit 20.

In one embodiment of the present invention, the first conductor 13 is connected to a power conductor, and the second conductor 14 is connected to a return path. A DC current transmitted on the power conductor will flow through the first conductor 13, and a return current transmitted on the return path will flow through the second conductor 14. In other embodiment of the present invention, the first conductor 13 is connected to the return path, and the second conductor 14 is connected to the power conductor. The DC current transmitted on the power conductor will flow through the second conductor 14, and the return current transmitted on the return path will flow through the first conductor 13.

The structure of the power noise suppression circuit 100 is simulated by an equivalent circuit model. An inductor is equivalently formed by the first metal pad 131, the third conductor 1311, and part of the second conductor 14 around the first slot portion 141, a capacitor is equivalently formed between the first metal pad 131 and the first conductor 13, and a resistor is equivalently formed by a first impedance unit 1412, such that an RLC equivalent resonance circuit will be equivalently formed from the structure of the first power noise to heat converter 10. Furthermore, an inductor is equivalently formed by the second metal pad 132 and the fourth conductor 1321, and a capacitor is equivalently formed between the second metal pad 132 and the first conductor 13, such that an LC equivalent resonance circuit will be equivalently formed from the structure of the anti-power noise transmitted unit 20. The power noise suppression circuit 100 absorbs the power noises within the specific frequency band by the RLC equivalent resonance circuit equivalently formed from the structure of the first power noise to heat converter 10, and reflects the power noises within the specific frequency band by the LC equivalent resonance circuit equivalently formed from the structure of the anti-power noise transmitted unit 20.

Figure 6:
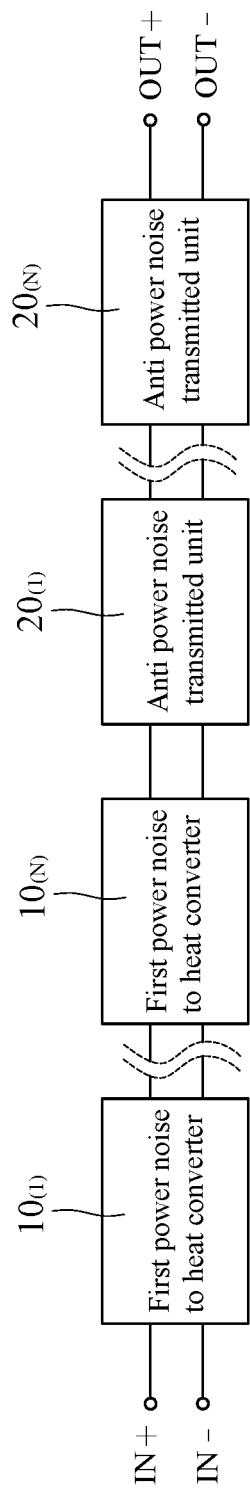
FIG. 6 is a circuit block diagram of the power noise suppression circuit according to another embodiment of the present invention.

Referring to FIG. 6, there is shown a circuit block diagram of the power noise suppression circuit according to another embodiment of the present invention. As shown in FIG. 6, the power noise suppression circuit 101 of the present embodiment comprises a plurality of first power noise to heat converters $10_{(1)}$~$10_{(N)}$ and a plurality of anti-power noise transmitted units $20_{(1)}$~$20_{(N)}$. Each of the first power noise to heat converters 10 is designed for the power noises within at least one specific frequency band, and used to absorb the power noises within the at least one corresponding specific frequency band. Each of the anti-power noise transmitted units 20 is designed for the power noises within at least one specific frequency band, and used to reflect the power noises within the at least one corresponding specific frequency band. The power noise suppression circuit 101 can suppress the power noises within the different specific frequency bands by the combination of the plurality of first power noise to heat converters $10_{(1)}$~$10_{(N)}$ and the plurality of anti-power noise transmitted units $20_{(1)}$~$20_{(N)}$.

As shown in FIGS. 2 and 3, in one embodiment of the present invention, the specific frequency band of the power noises to be absorbed by each of the first power noise to heat converters 10 can be decided by adjusting the slot size of the first slot portion 111, the size of the first metal block 1111, the gap between the conductors 11 and 12, and/or the impedance value of the first impedance unit 1112; the specific frequency band of the power noises to be reflected by each of the anti-power noise transmitted units 20 can be decided by adjusting the slot size of the second slot portion 112, the size of the second metal block 1121, and/or the gap between the conductors 11 and 12.

As shown in FIGS. 4 and 5, in other embodiment of the present invention, the specific frequency band of the power noises to be absorbed by each of the first power noise to heat converters 10 can be decided by adjusting the slot size of the first slot portion 141, the size of the first metal pad 131, the gap between the first conductor 13 and the first metal pad 131, the gap between the second conductor 14 and the first metal pad 131, the length of the third conductor 1311, and/or the impedance value of the first impedance unit 1412; the specific frequency band of the power noises to be reflected by each of the anti-power noise transmitted units 20 can be decided by adjusting the size of the second metal pad 132, the gap between the first conductor 13 and the second metal pad 132, the gap between the second conductor 14 and the second metal pad 132, and/or the length of the fourth conductor 1321.

Figure 7:
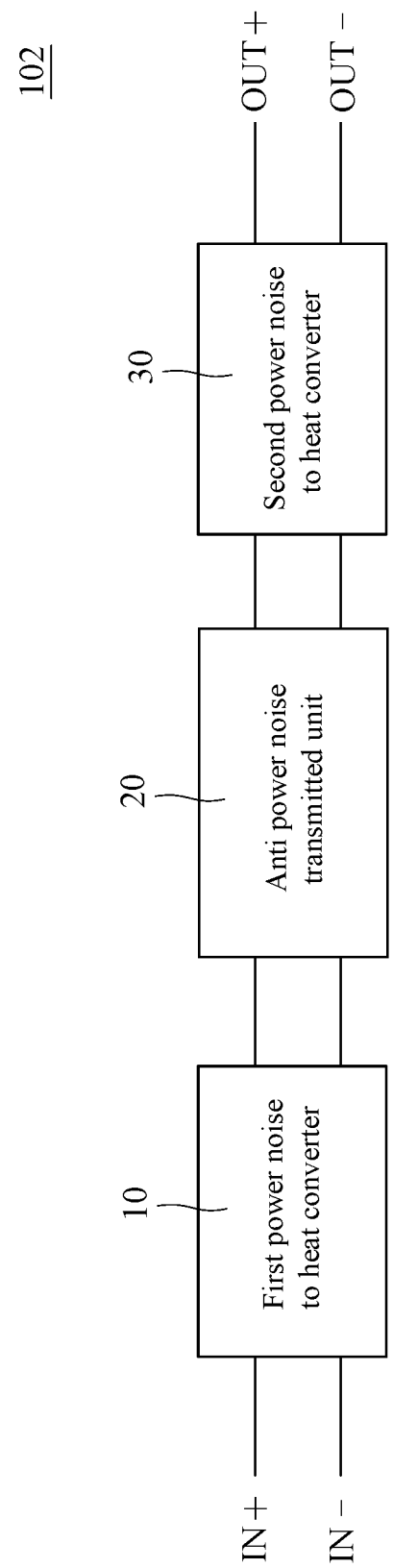
FIG. 7 is a circuit block diagram of the power noise suppression circuit according to another embodiment of the present invention.

Referring to FIG. 7, there is shown a circuit block diagram of the power noise suppression circuit according to another embodiment of the present invention. As shown in FIG. 7, the power noise suppression circuit 102 of the present embodiment further comprises at least one second power noise to heat converter 30. The anti-power noise transmitted unit 20 is configured between the first power noise to heat converter 10 and the second power noise to heat converter 30. The DC power is inputted into the first power noise to heat converter 10, passed through the anti-power noise transmitted unit 20, and outputted from the second power noise to heat converter 30. Otherwise, the DC power is inputted into the second power noise to heat converter 30, passed through the anti-power noise transmitted unit 20, and outputted from the first power noise to heat converter 10.

Figure 8:
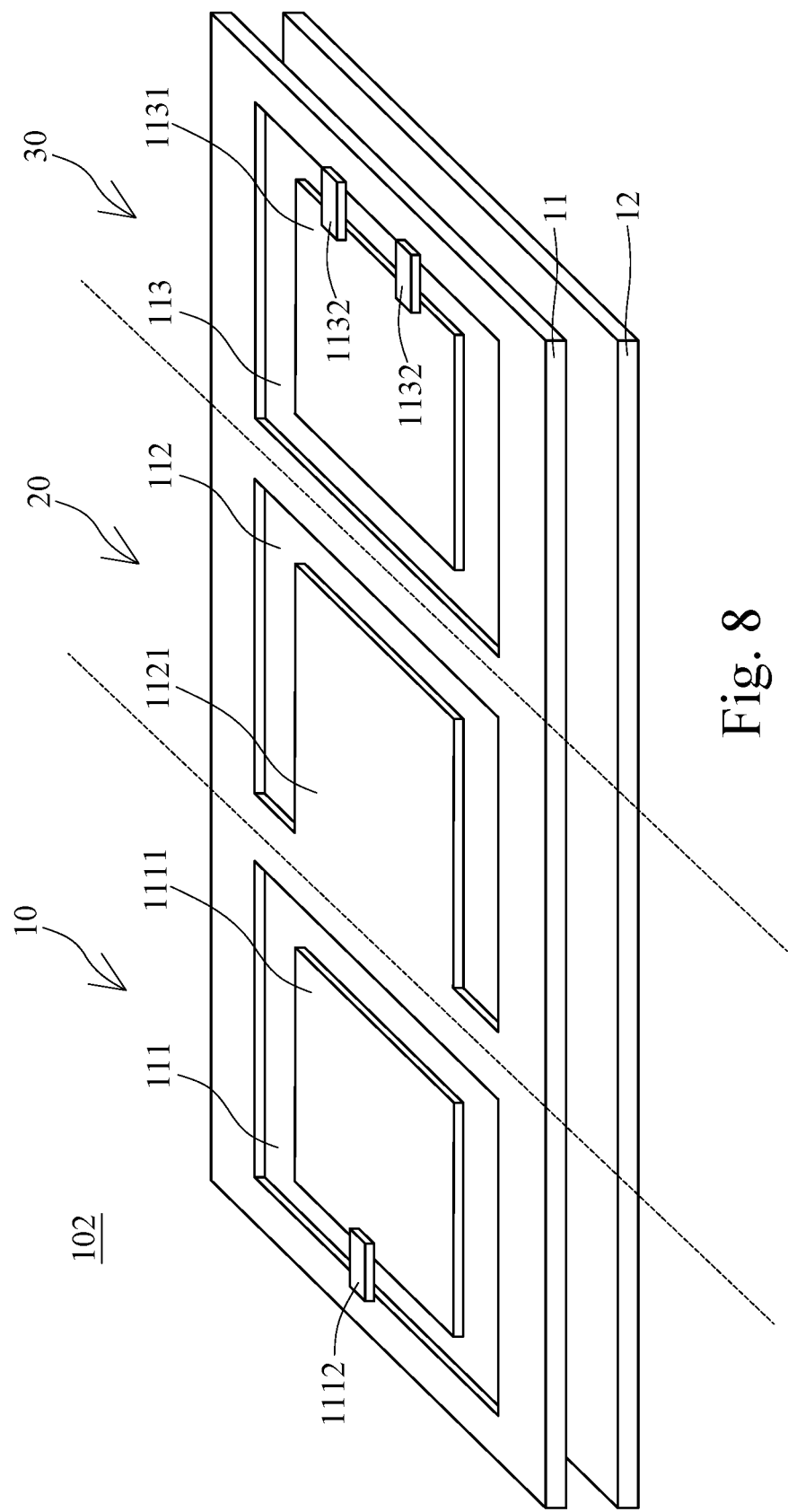
FIG. 8 is a three-dimensional structural view of the power noise suppression circuit according to another embodiment of the present invention.
Figure 10:
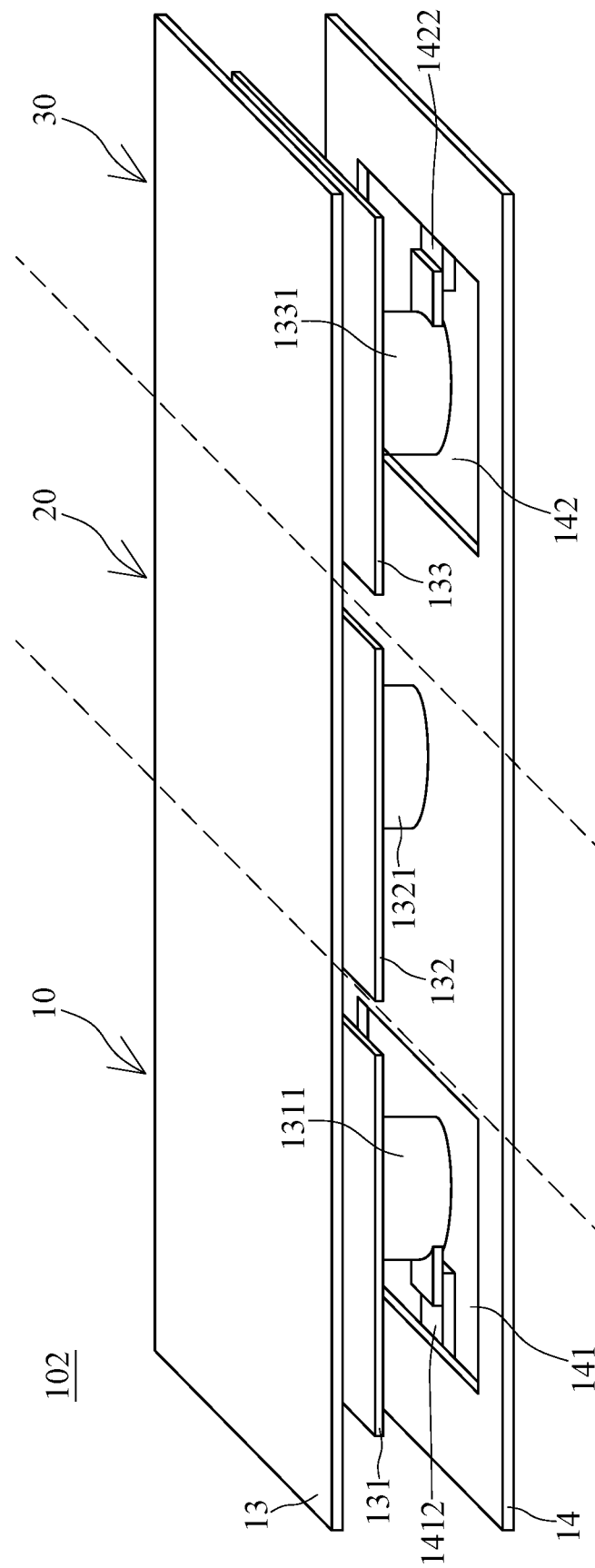
FIG. 10 is a three-dimensional structural view of the power noise suppression circuit according to another embodiment of the present invention.

The second power noise to heat converter 30 also has at least one lossy element (such as the second impedance unit 1132 in FIG. 8, or the second impedance units 1142 in FIG. 10). For the circuit design of the present invention, input impedance of the power noise suppression circuit 102 from the second power noise to heat converter 30 direction is designed to match to the power system within at least one specific frequency band. When the power noises within the specific frequency band enters the second power noise to heat converter 30, the second power noise to heat converter 30 absorbs the power noises within the specific frequency band by at least one lossy element so as to convert the power noises within the specific frequency band to the thermal energy. Thus, the first power noise to heat converter 10 and the second power noise to heat converter 30 are configured on the input ends and the output ends of the power noise suppression circuit 102, respectively, so as to achieve the effect of bidirectional absorption of the power noises.

Besides, when the power noises within the specific frequency band is unabsorbed by the first power noise to heat converter 10 or the second power noise to heat converter 30, and inputted to the anti-power noise transmitted unit 20 through the first power noise to heat converter 10 or the second power noise to heat converter 30, the anti-power noise transmitted unit 20 will reflect the power noises within the specific frequency band back to the first power noise to heat converter 10 or the second power noise to heat converter 30, so that the first power noise to heat converter 10 or the second power noise to heat converter 30 absorbs the power noises within the specific frequency band again. Thus, the power noises within the specific frequency band is able to be repeatedly absorbed and reflected between the first power noise to heat converter 10 and the anti-power noise transmitted unit 20 or between the second power noise to heat converter 30 and the anti-power noise transmitted unit 20 until the energy of the power noises within the specific frequency band is completely consumed.

Figure 9:
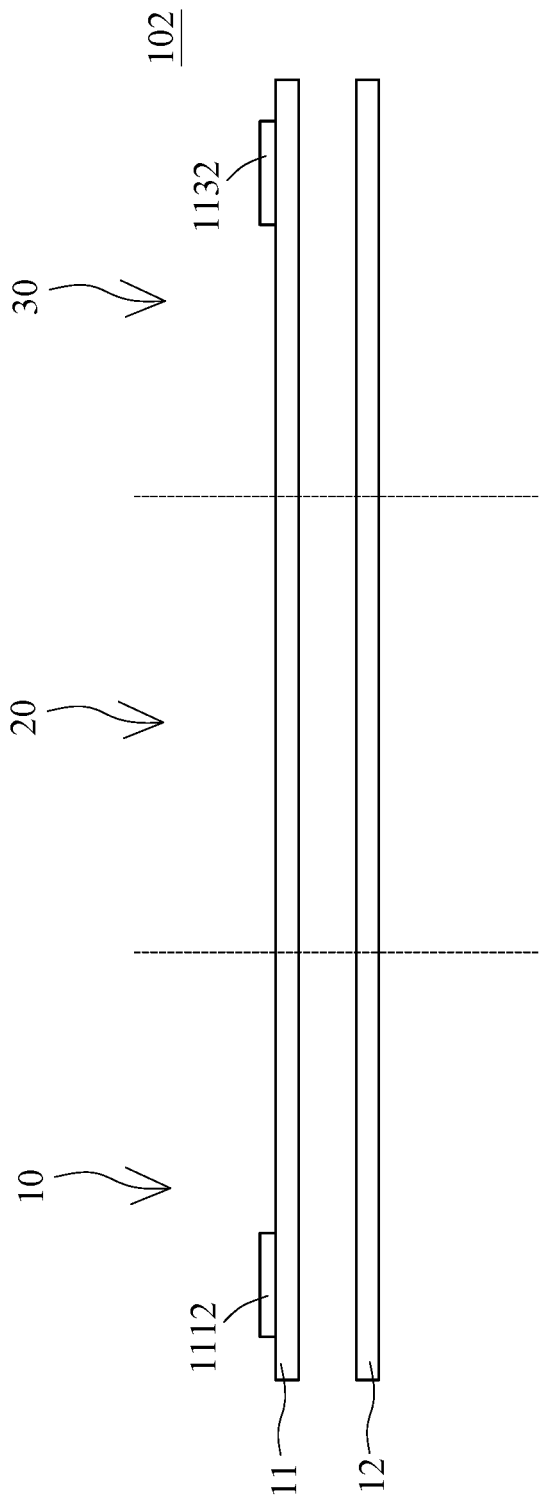
FIG. 9 is a structural cross-sectional view of the power noise suppression circuit according to another embodiment of the present invention.

Referring to FIG. 8 and FIG. 9, there are shown a three-dimensional structural view and a structural cross-sectional view of the power noise suppression circuit according to another embodiment of the present invention, and also referring to FIG. 7. Compared to the power noise suppression circuit 100 in the embodiment of FIGS. 2 and 3, the first conductor 11 of the power noise suppression circuit 102 in the embodiment of FIGS. 8 and 9 further comprises a third slot portion 113. The first conductor 11 is provided at one side thereof with the first slot portion 111, and provided at other side thereof with the third slot portion 113. The second slot portion 112 is disposed between the first slot portion 111 and the third slot portion 113. The third slot portion 113 comprises a third metal block 1131, and connected the first conductor 11 via at least one second impedance unit 1132. The third slot portion 113, the third metal block 1131, the second impedance unit 1132, part of the first conductor 11 around the third slot portion 113, and part of the second conductor 12 corresponding to part of the first conductor 11 around the third slot portion 113 will be combined into the second power noise to heat converter 30. In the present invention, the first metal block 1111, the second metal block 1121, and the third metal block 1131 can be square blocks, oval blocks, diamond blocks, or any other shape blocks.

An inductor is equivalently formed by the third metal block 1131 and part of the first conductor 11 around the third slot portion 113, a capacitor is equivalently formed between the third metal block 1131 and the second conductor 12, and a resistor is equivalently formed by a second impedance unit 1132, such that another RLC equivalent resonance circuit will be equivalently formed from the structure of the second power noise to heat converter 30. Thus, the power noise suppression circuit 102 absorbs the power noises within the specific frequency band by the RLC equivalent resonance circuits equivalently formed from the structure of the power noise to heat converters 10 and 30, and reflects the power noises within the specific frequency band by the LC equivalent resonance circuit equivalently formed from the structure of the anti-power noise transmitted unit 20.

Figure 11:
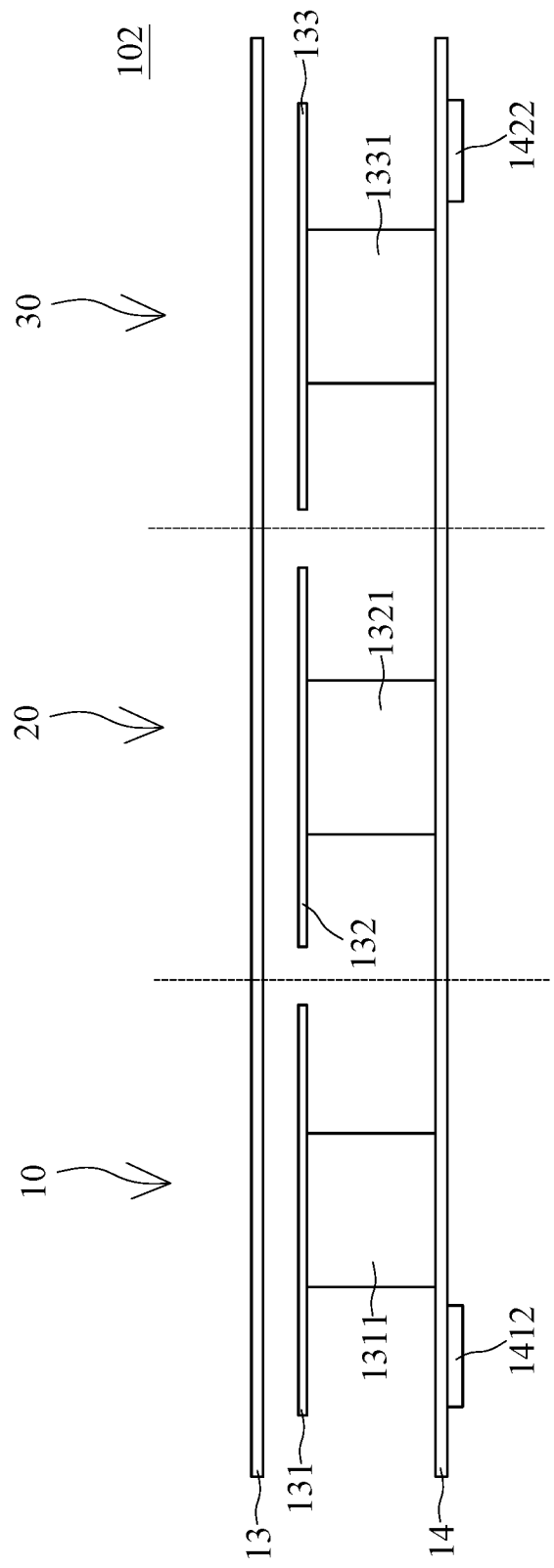
FIG. 11 is a structural cross-sectional view of the power noise suppression circuit according to another embodiment of the present invention.

Referring to FIG. 10 and FIG. 11, there are shown a three-dimensional structural view and a structural cross-sectional view of the power noise suppression circuit according to another embodiment of the present invention, and also referring to FIG. 7. Compared to the power noise suppression circuit 100 in the embodiment of FIGS. 4 and 5, the second conductor 14 of the power noise suppression circuit 102 in the embodiment of FIGS. 10 and 11 further comprises a second slot portion 142. There is a third metal pad 133 and a gap exists between the third metal pad 133 and the first conductor 13. A fifth conductor 1331 is extended between the third metal pad 133 and the second slot portion 142 of the second conductor 14 in a vertical direction or a horizontal direction. The fifth conductor 1331 is connected at one end thereof to the third pad 133, and connected at other end thereof to the second conductor 14 via a second impedance unit 1422. The first metal pad 131 and the third metal pad 133 are respectively disposed on two sides of the second metal pad 132.

An inductor is equivalently formed by the third metal pad 133, the fifth metal block 1331, and part of the second conductor 14 around the second slot portion 142, a capacitor is equivalently formed between the third metal pad 133 and the first conductor 13, and a resistor is equivalently formed by a second impedance unit 1422, such that another RLC equivalent resonance circuit will be equivalently formed from the structure of the power noise to heat converter 30. Thus, the power noise suppression circuit 102 can bidirectionally absorb the power noises within the specific frequency band by the RLC equivalent resonance circuits equivalently formed from the structure of the power noise to heat converters 10 and 30, and reflect the power noises within the specific frequency band by the LC equivalent resonance circuit equivalently formed from the structure of the anti-power noise transmitted unit 20.

The power noise suppression circuit 102 can also include a plurality of the first power noise to heat converters 10, a plurality of the anti-power noise transmitted units 20, and a plurality of the second power noise to heat converters 30. Each of the first power noise to heat converters 10 or each of the second power noise to heat converters 30 is designed for at least one specific frequency band, and used to absorb the power noises within the at least one corresponding specific frequency band. Each of the anti-power noise transmitted units 20 is designed for at least one specific frequency band, and used to reflect the power noise(s) within the at least one corresponding specific frequency band. Thus, the power noise suppression circuit 102 can bidirectionally absorb the power noises within the same specific frequency band or the different specific frequency band by the use of the same or the different power noise to heat converters 10 and 30, and reflect the power noises within the same specific frequency band or the different specific frequency band by the use of the same or the different anti-power noise transmitted units 20.

In one embodiment of the present invention, the power system can be configured with a plurality of the power noise suppression circuits 100/101/102, which are connected together in series or in parallel, and used for suppressing the power noises within the same specific frequency band or the different specific frequency band, respectively.

In another embodiment of the present invention, the power system can be configured with a plurality of the power noise suppression circuits 100/101/102, which can be separately arranged at any position of the power system or around a noise source, and used for suppressing the power noises within the same specific frequency band or the different specific frequency band, respectively.

Figure 12:
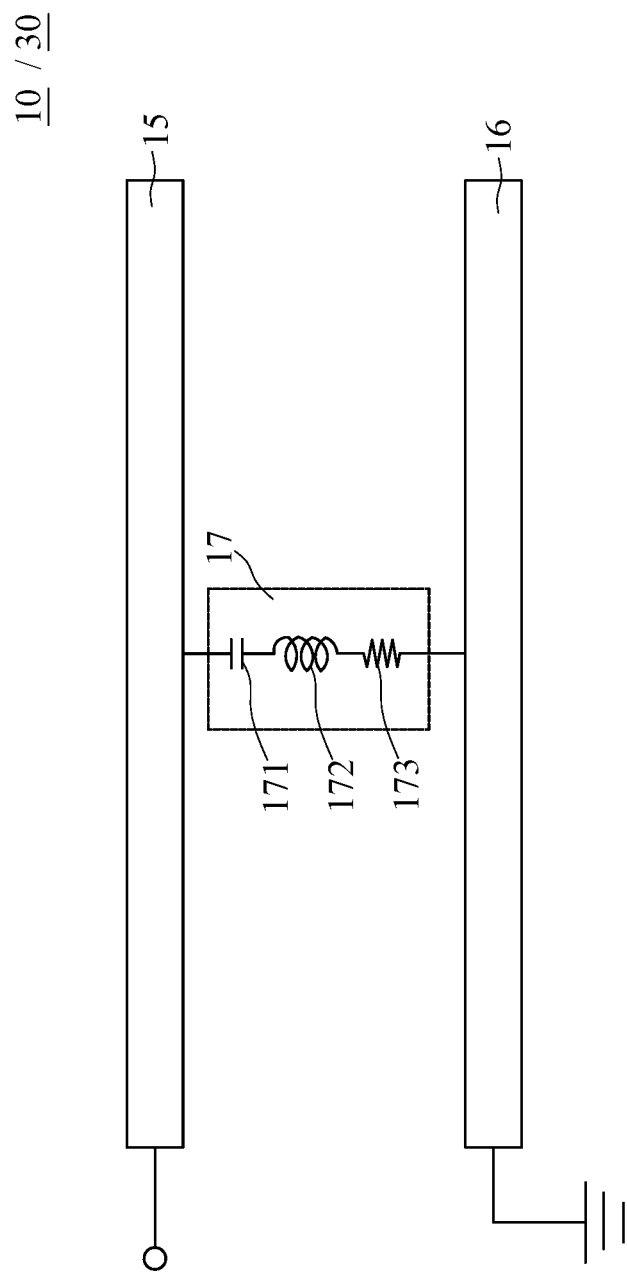
FIG. 12 is an equivalent circuit diagram of the first power noise to heat converter or the second power noise to heat converter of the power noise suppression circuit according to one embodiment of the present invention.

Referring to FIG. 12, there is shown an equivalent circuit diagram of the first power noise to heat converter or the second power noise to heat converter of the power noise suppression circuit according to one embodiment of the present invention. As shown in FIG. 12, the first power noise to heat converter 10 or the second power noise to heat converter 30 comprises a first conductor 15 and a second conductor 16. The first conductor 15 is connected to a power conductor, and the second conductor 16 is connected to a return path. A DC current provided by the power system will pass through the first conductor 15, and a return current provided by the power system will pass through the second conductor 16.

A first equivalent circuit 17 is equivalently formed between the first conductor 15 and the second conductor 16 of the power noise to heat converters 10, 30. The first equivalent circuit 17 comprises at least one first capacitor 171, at least one first inductor 172, and at least one first resistor 173. In the first equivalent circuit 17 of the embodiment of FIG. 12, the first capacitor 171, the first inductor 172, and the first resistor 173 are connected between the first conductor 15 and the second conductor 16 in series.

Figure 13:
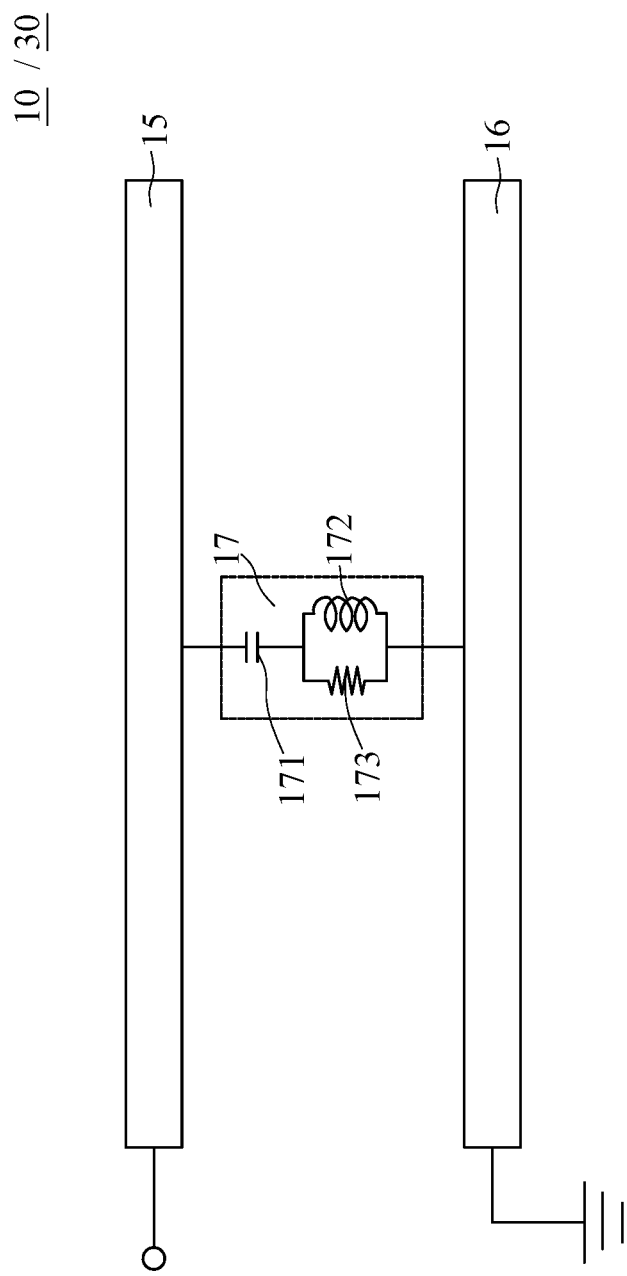
FIG. 13 is an equivalent circuit diagram of the first power noise to heat converter or the second power noise to heat converter of the power noise suppression circuit according to another embodiment of the present invention.

Otherwise, in the first equivalent circuit 17 of the embodiment of FIG. 13, the first inductor 172 and the first resistor 173 are connected in parallel; the first capacitor 171 is connected at one end thereof to the first conductor 15, and the first capacitor 171 is connected at other end thereof to the second conductor 16 via the first inductor 172 and the first resistor 173 connected therewith in parallel.

Figure 14:
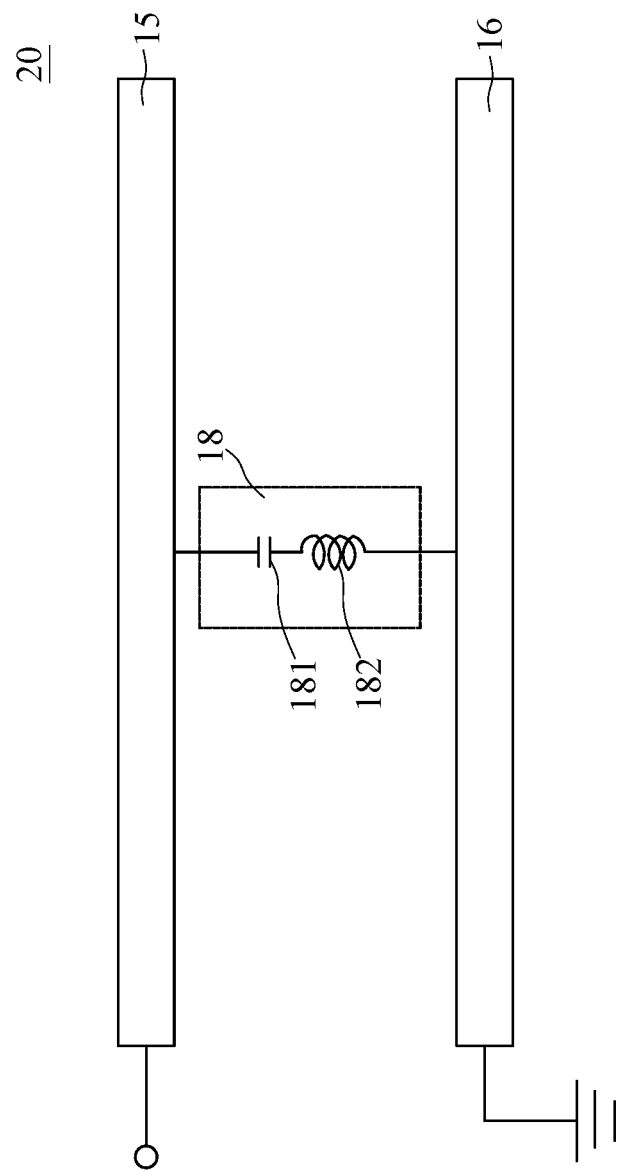
FIG. 14 is an equivalent circuit diagram of the anti-power noise transmitted unit of the power noise suppression circuit according to one embodiment of the present invention.

Referring to FIG. 14, there is shown an equivalent circuit diagram of the anti-power noise transmitted unit of the power noise suppression circuit according to one embodiment of the present invention. As shown in FIG. 14, the anti-power noise transmitted unit 20 comprises a first conductor 15 and a second conductor 16. The first conductor 15 is connected to a power conductor, and the second conductor 16 is connected to a return path.

A second equivalent circuit 18 is equivalently formed between the first conductor 15 and the second conductor 16 of the anti-power noise transmitted unit 20. The second equivalent circuit 18 comprises at least one second capacitor 181 and at least one second inductor 182. In the second equivalent circuit 18 of the embodiment of FIG. 14, the second capacitor 181 and the second inductor 182 are connected between the first conductor 15 and the second conductor 16 in series.

Figure 15:
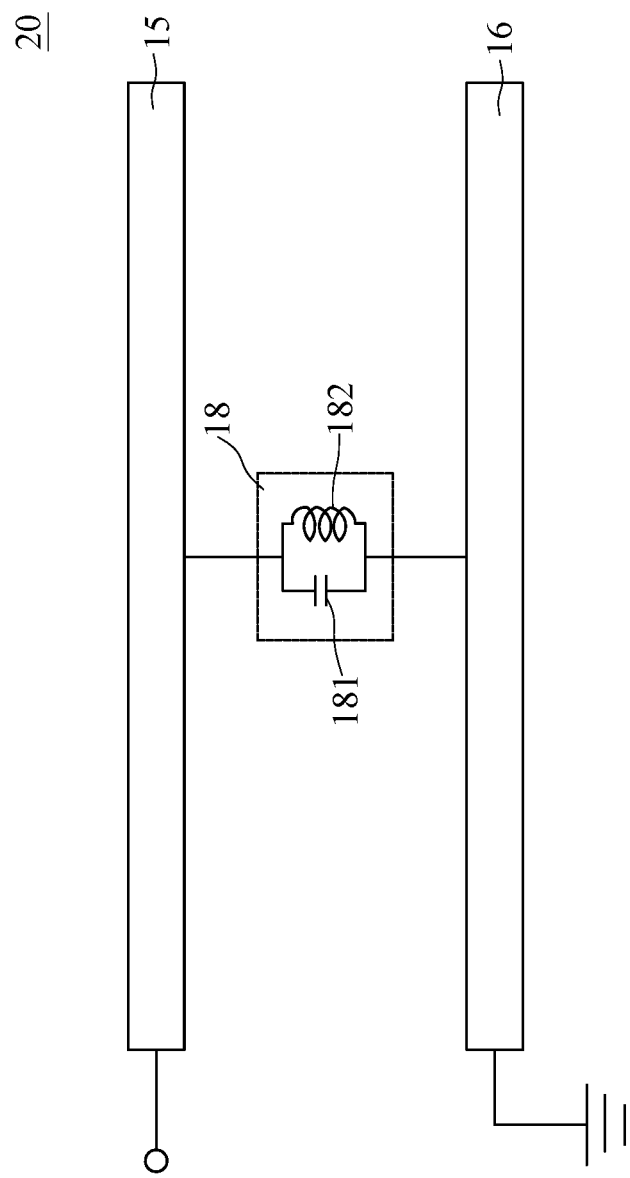
FIG. 15 is an equivalent circuit diagram of the anti-power noise transmitted unit of the power noise suppression circuit according to another embodiment of the present invention.

Otherwise, in the second equivalent circuit 18 of the embodiment of FIG. 15, the second capacitor 181 and the second inductor 182 is connected between the first conductor 15 and the second conductor 16 in parallel.

Figure 16:
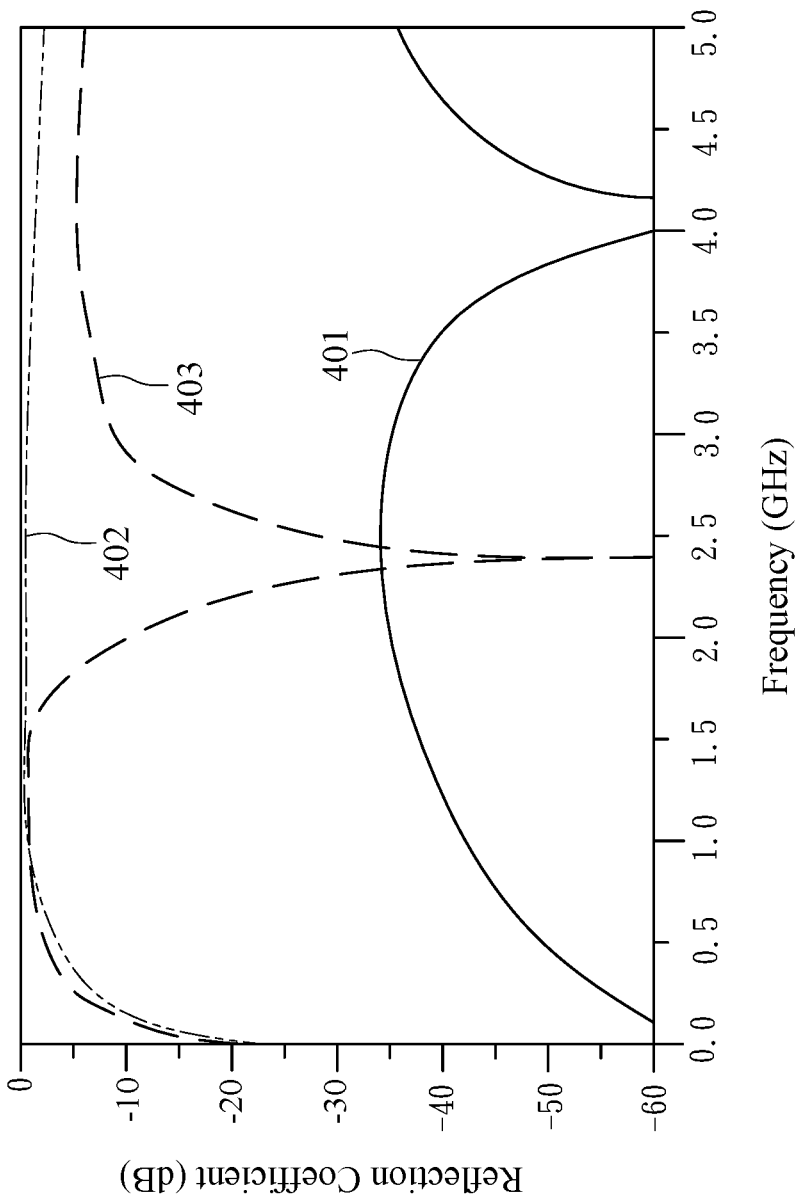
FIG. 16 is an oscillogram of reflection coefficients of the power noises obtained by measuring the power system without any power noise suppression mechanism, the power system configured with a decoupling capacitor, and the power system configured with the power noise suppression circuit of the present invention.

Referring to FIG. 16, there is shown an oscillogram of reflection coefficients of the power noises obtained by measuring the power system without any power noise suppression mechanism, the power system configured with a decoupling capacitor, and the power system configured with the power noise suppression circuit of the present invention. The reflection coefficients of the power noise are measured by the vector network analyzer (VNA). The two ports of the power system without any power noise suppression mechanism are named as Port 1 and Port 2. The two ports of the power system that is configured with a decoupling capacitor are named as Port 3 and Port 4. The two ports of the power system that is configured with the power noise suppression circuit of the present invention are named as Port 5 and Port 6.

As shown in FIG. 16, a curve 401 may be obtained by measuring a reflection coefficient S(1,1) of the power noises for the power system without any power noise suppression mechanism; a curve 402 may be obtained by measuring a reflection coefficient S(3,3) of the power noises for the power system configured with the decoupling capacitor; curve 403 may be obtained by measuring a reflection coefficient S(5,5) of the power noises for the power system configured with the power noise suppression circuit of the present invention.

Referring to the curve 401, the reflection coefficient S(1,1) of the power noises for the power system without any power noise suppression mechanism is lower than −20 dB within the frequency band between 0 GHz to 5 GHz, which means that the power system without any power noise suppression mechanism seldom reflects power noises within 0 GHz to 5 GHz. Referring to the curve 402, the reflection coefficient S(3,3) of the power noise for the power system configured with the decoupling capacitor is close to 0 dB within the frequency band between 0 GHz to 5 GHz, which means that the decoupling capacitor reflects the power noises within the frequency band between 0 GHz to 5 GHz back to a noise source thoroughly. Referring to the curve 403, the reflection coefficient S(5,5) of the power noises for the power system configured with the power noise suppression circuit of the present invention is lower than −20 dB within the frequency band between 2.3 GHz to 2.6 GHz, which means that the power system configured with the power noise suppression circuit of the present invention has a lower reflection for the power noises within the frequency band between 2.3 GHz to 2.6 GHz.

Figure 17:
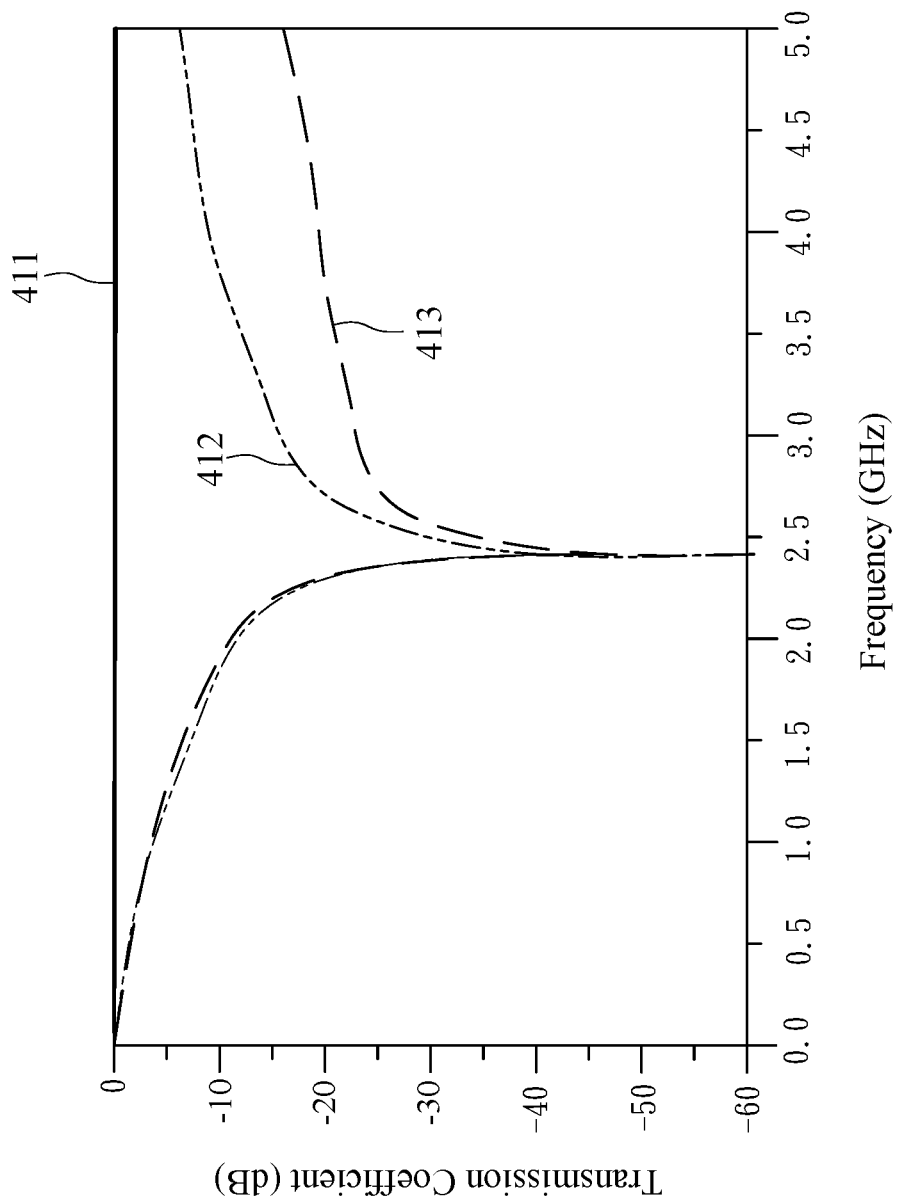
FIG. 17 is an oscillogram of transmission coefficients of the power noises obtained by measuring the power system without any power noise suppression mechanism, the power system configured with a decoupling capacitor, and the power system configured with the power noise suppression circuit of the present invention.

Referring to FIG. 17, there is shown an oscillogram of transmission coefficients of the power noises obtained by measuring the power system without any power noise suppression mechanism, the power system configured with a decoupling capacitor, and the power system configured with the power noise suppression circuit of the present invention. The transmission coefficients of the power noises are measured by the vector network analyzer (VNA). The two ports of the power system without any power noise suppression mechanism are named as Port 1 and Port 2. The two ports of the power system that is configured with a decoupling capacitor are named as Port 3 and Port 4. The two ports of the power system that is configured with the power noise suppression circuit of the present invention are named as Port 5 and Port 6.

As shown in FIG. 17, a curve 411 may be obtained by measuring a transmission coefficient S(2,1) of the power noises for the power system without any power noise suppression mechanism; a curve 412 may be obtained by measuring a transmission coefficient S(4,3) of the power noises for the power system configured with the decoupling capacitor; a curve 413 may be obtained by measuring a transmission coefficient S(6,5) of the power noises for the power system configured with the power noise suppression circuit of the present invention.

Referring to the curve 411, the transmission coefficient S(2,1) of the power noises for the power system without any power noise suppression mechanism is closed to 0 dB within the frequency band between 0 GHz to 5 GHz, which means that the power noises are transmitted between the two ports of the power system without any power noise suppression mechanism. Referring to the curve 412, the transmission coefficient S(4,3) of the power noises for the power system configured with the decoupling capacitor is lower than −20 dB within the frequency band between 2 GHz to 2.7 GHz, which means that the decoupling capacitor can prohibit the power noises within the frequency band between 2 GHz to 2.7 GHz from transmitting between the two ports of the power system. Referring to the curve 413, the transmission coefficient S(6,5) of the power noise for the power system configured with the power noise suppression circuit of the present invention is lower than −20 dB within the frequency band between 2 GHz to 3.5 GHz, which means that the power noise suppression circuit of the present invention can also prohibit the power noises within the frequency band between 2 GHz to 3.5 GHz from transmitting between the two ports of the power system.

Accordingly, it is known from the curve 401 in FIG. 16 and the curve 411 in FIG. 17, the power system without any power noise suppression mechanism will not have any suppression effect to the power noises such that the power noises will not be reflected and will pass through the two ports of the power system at any frequency band thoroughly; it is known from the curve 402 in FIG. 16 and the curve 412 in FIG. 17, although the power system can prevent power noises from transmitting by the configuration of the decoupling capacitor, the power noises will be reflected back to the noise source, which will increase the voltage drops of a chip at the reflected end of the power system such that the signal quality of the chip may be affected and the reflected power noises may further radiate and interfere with the operations of surrounding antenna and communication modules; it is known from the curve 403 in FIG. 16 and the curve 413 in FIG. 17, the power system with the power noise suppression circuit of the present invention can prevent the power noises within the specific frequency band (such as 2.3 GHz~2.6 GHz) from both reflecting and transmitting so as to keep power system more stable and avoid possible signal or radiation issues.

Figure 18:
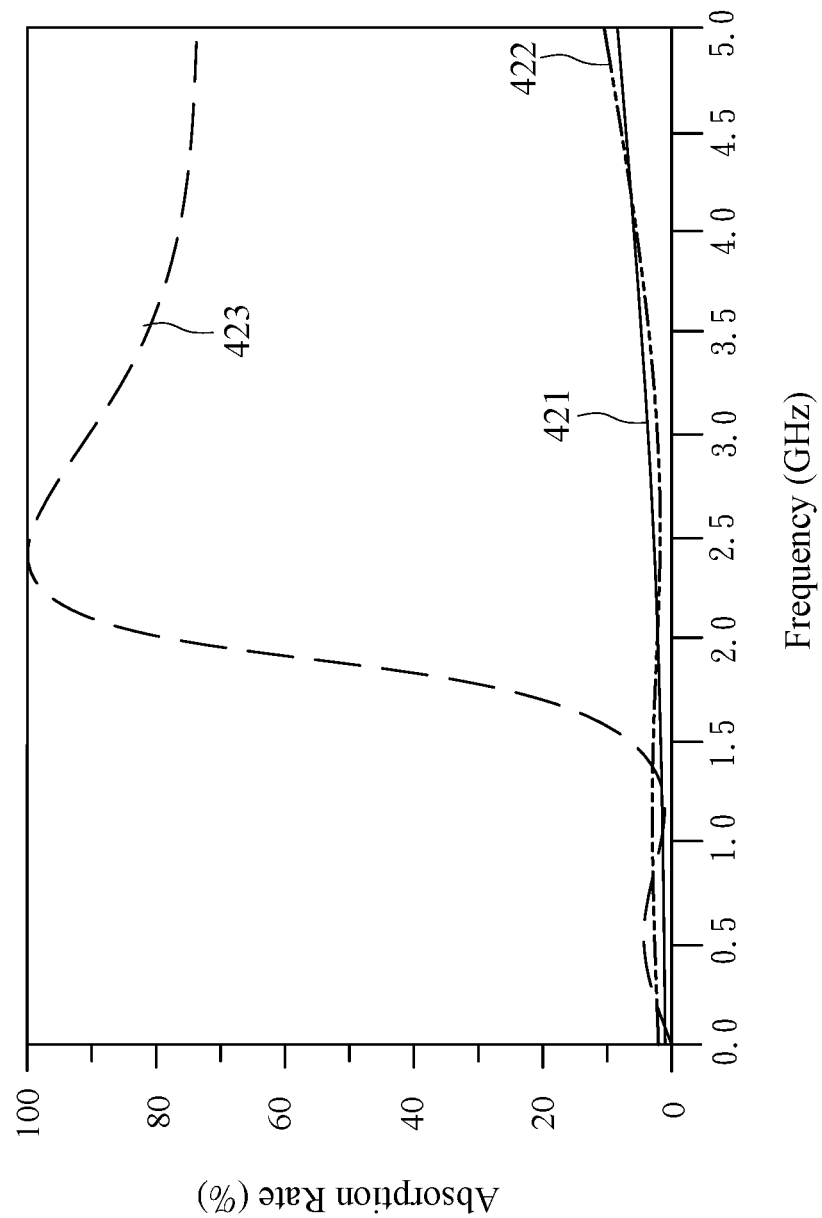
FIG. 18 is an oscillogram of absorption rates of the power noises obtained by measuring the power system without any power noise suppression mechanism, the power system configured with a decoupling capacitor, and the power system configured with the power noise suppression circuit of the present invention.

Referring to FIG. 18, there is shown an oscillogram of absorption rates of the power noises obtained by measuring the power system without any power noise suppression mechanism, the power system configured with a decoupling capacitor, and the power system configured with the power noise suppression circuit of the present invention. As shown in FIG. 18, a curve 421 represents the absorption rate of the power noises related to the power system without any power noise suppression mechanism, a curve 422 represents the absorption rate of the power noises related to the power system configured with the decoupling capacitor, and a curve 423 represents the absorption rate of the power noises related to the power system configured with the power noise suppression circuit of the present invention. The absorption rate of the power noises of the curve 421 is defined as $(1-|s_{11}|^2-|s_{21}|^2) \times 100\%$. The absorption rate of the power noises of the curve 422 is defined as $(1-|s_{33}|^2-|s_{43}|^2) \times 100\%$. The absorption rate of the power noises of the curve 423 is defined as $(1-|s_{55}|^2-|s_{65}|^2) \times 100\%$.

According to the curve 421, it is shown that the absorption rate of the power noises for a power system without any power noise suppression mechanism is almost zero. According to the curve 422, it is shown that the absorption rate of the power noises for a power system configured with the decoupling capacitor is also almost zero, since the decoupling capacitor reflects the power noises back to the noise source instead of absorbing the power noises. According to the curve 423, it is shown that the absorption rate of the power noises for a power system configured with the power noise suppression circuit of the present invention is more than 50% at a frequency above 1.7 GHz, and the absorption rate of the power noises is even proximately 100% at a frequency near 2.4 GHz.

Figure 19:
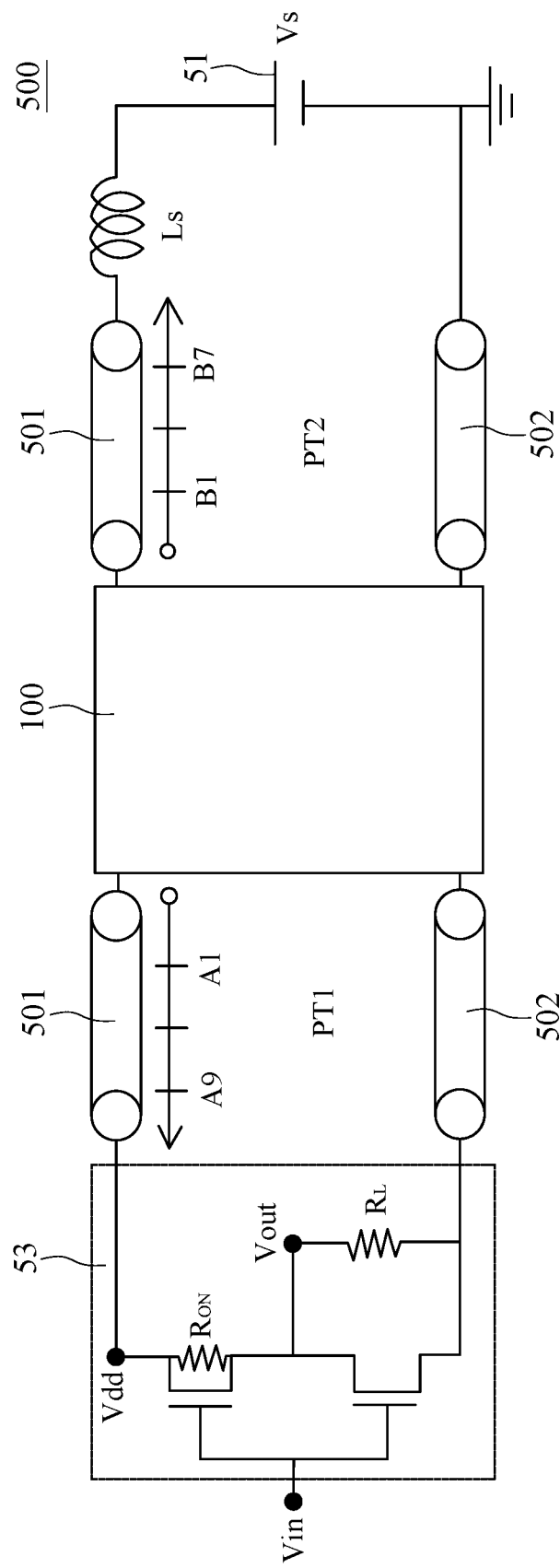
FIG. 19 is a circuit diagram of a power system.
Figure 20:
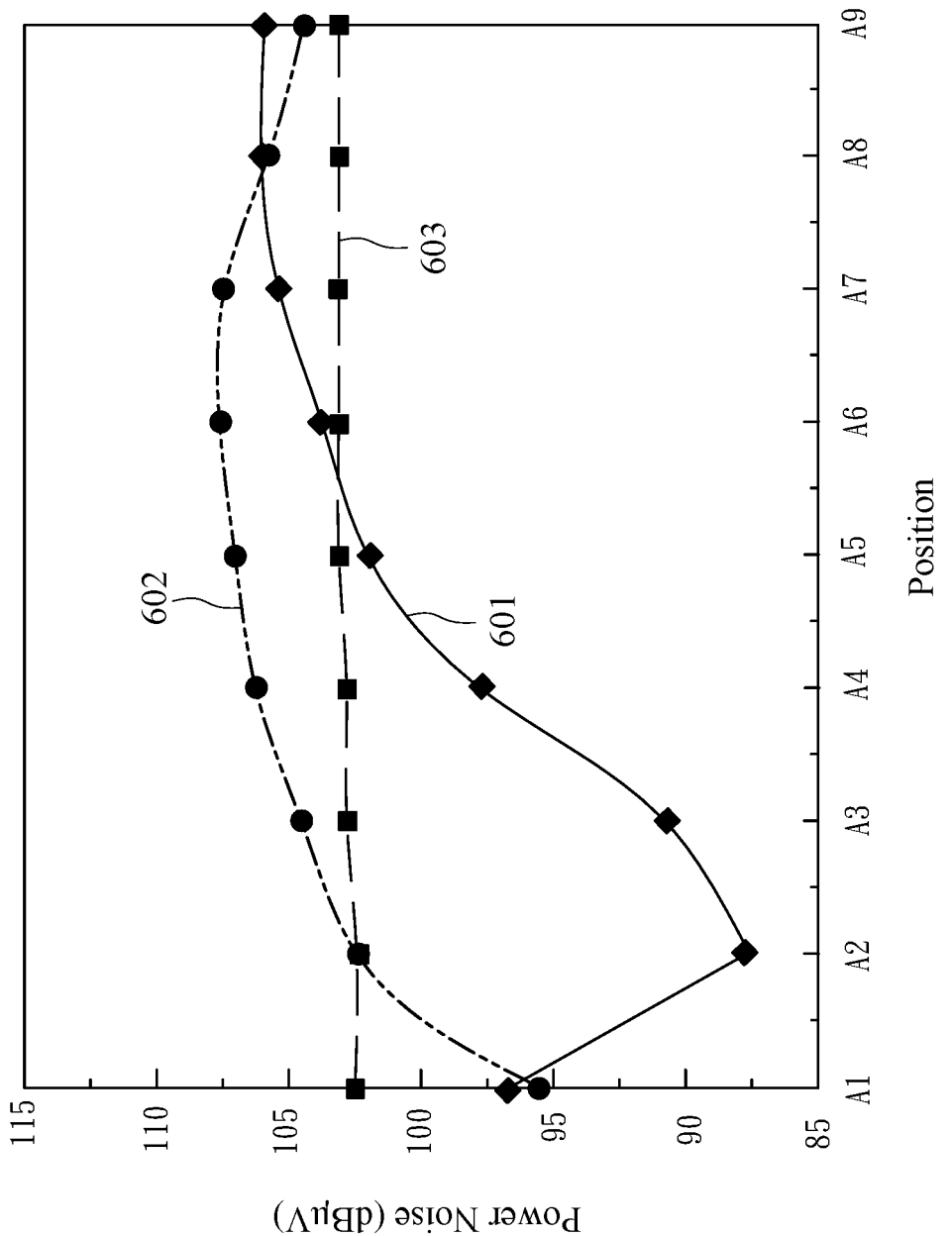
FIG. 20 is an oscillogram of 2.4-GHz components of the power noises measured at multiple specific locations on the left side (i.e. power noise reflective end) of the power system in FIG. 19.
Figure 21:
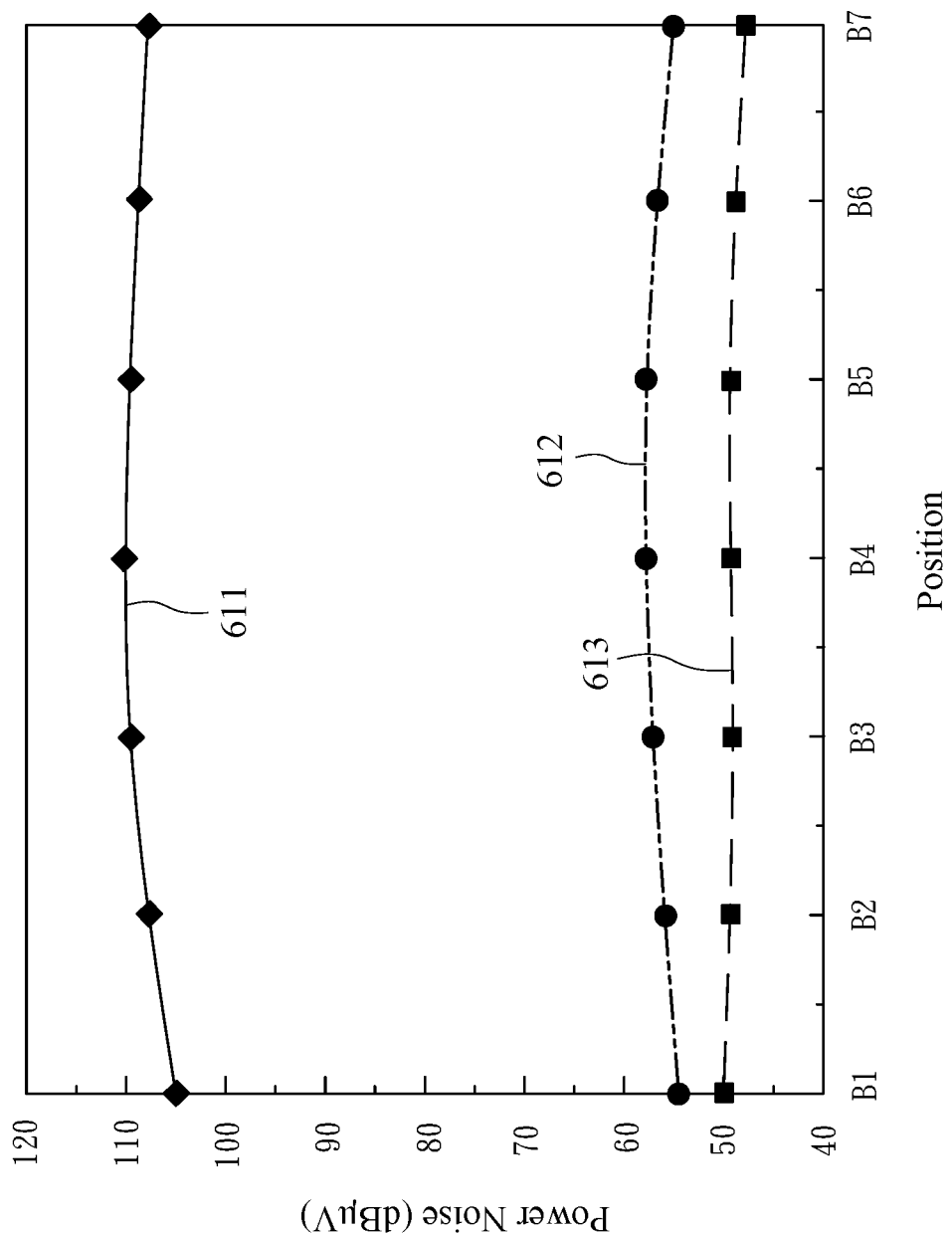
FIG. 21 is an oscillogram of 2.4-GHz components of the power noises measured at multiple specific locations on the right side (i.e. power noise transmitted end) of the power system in FIG. 19.

Referring to FIG. 19~FIG. 21, wherein FIG. 19 is a circuit diagram of a power system, FIG. 20 is an oscillogram of 2.4-GHz components of the power noises measured at multiple specific locations on the left side (i.e. power noise reflective end) of the power system in FIG. 19, and FIG. 21 is an oscillogram of 2.4-GHz components of the power noises measured at multiple specific locations on the right side (i.e. power noise transmitted end) of the power system in FIG. 19. As shown in FIG. 19, the power system 500 includes a voltage source 51 and an inverter 53. The voltage source 51 may be connected to the inverter 53 via a power conductor 501 and a return path 502. The inverter 53 of the power system 500 may be operated at a frequency 800 MHz. The power system 500 of FIG. 19 may employ the power noise suppression circuit 100 of the present invention to suppress a third harmonic power noise at frequency 2.4 GHz.

As shown in FIG. 19, the left side of the power system 500 is regarded as a power noise reflective end which is located between the power noise suppression circuit 100 and the inverter 53. A curve 603 in FIG. 20 can be obtained by measuring 2.4-GHz components of the power noises at multiple locations (A1~A9) of the power noise reflective end of the power system 500. Otherwise, the power system 500 may also employ the decoupling capacitor to suppress the third harmonic power noises at frequency 2.4 GHz, wherein the left side of the power system 500 is regarded as a power noise reflective end which is located between the decoupling capacitor and the inverter 53, in this case, a curve 602 in FIG. 20 can be obtained by measuring 2.4-GHz components of the power noises at multiple locations (A1~A9) of the power noise reflective end of the power system 500. Otherwise, as for a power system 500 without any power noise suppression circuit, a curve 601 in FIG. 20 can be obtained by measuring 2.4-GHz components of the power noises at multiple locations (A1~A9) of the power noise reflective end of the power system 500.

As shown in FIG. 19, the right side of the power system 500 is regarded as a power noise transmitted end which is located between the power noise suppression circuit 100 and the voltage source 51. A curve 613 in FIG. 21 can be obtained by measuring 2.4-GHz components of the power noises at multiple locations (B1~B9) of the power noise transmitted end of the power system 500. Otherwise, the power system 500 may also employ the decoupling capacitor to suppress the third harmonic power noises at 2.4 GHz, wherein the right side end of the power system 500 as a power noise transmitted end which is located between the decoupling capacitor and the voltage source 51, in this case, a curve 612 in FIG. 21 can be obtained by measuring 2.4-GHz components of the power noises at multiple locations (B1~B9) of the power noise transmitted end of the power system 500. Otherwise, as for a power system 500 without any power noise suppression circuit, a curve 611 in FIG. 21 can be obtained by measuring 2.4-GHz components of the power noises at multiple locations (B1~B9) of the power noise transmitted end of the power system 500.

From FIG. 20 and FIG. 21, it is shown that both of the power noise suppression circuit 100 and the decoupling capacitor can effectively prohibit the power noises from transmitting and can protect integrated circuits (ICs) which are located at the power noise transmitted end; however, for the power noise reflective end, magnitude of power noises varies at different locations for the power system 500 with the decoupling capacitor. It may generate excessive or intolerable power noises at certain locations of the power noise reflective end. In contrary, power noises of the power system 500 with the power noise suppression circuit 100 of the present invention maintain similar values at different locations. Accordingly, adding the power noise suppression circuit 100 of the present invention could make the power system 500 more stable.

The above disclosure is only the preferred embodiment of the present invention, and not used for limiting the scope of the present invention. All equivalent variations and modifications on the basis of shapes, structures, features and spirits described in the claims of the present invention should be included in the claims of the present invention.

What is claimed is:

1. A power noise suppression circuit, which is applied to a power system, comprising:
    at least one first power noise to heat converter comprising at least one first impedance unit; and
    at least one anti-power noise transmitted unit connected to the at least one first power noise to heat converter;
    wherein when at least one power noise within at least one specific frequency band enters the power noise suppression circuit, the at least one first power noise to heat converter absorbs the at least one power noise within the at least one specific frequency band by the at least one first impedance unit so as to convert the at least one power noise within at least one specific frequency band to a thermal energy, and the at least one anti-power noise transmitted unit reflects the at least one power noise within at least one specific frequency band to the at least one first power noise to heat converter.

2. The power noise suppression circuit according to claim 1, when the unabsorbed at least one power noise within at least one specific frequency band inputs to the at least one anti-power noise transmitted unit through the at least one first power noise to heat converter, the at least one anti-power noise transmitted unit reflects the at least one power noise within at least one specific frequency band back to the at least one first power noise to heat converter so that the at least one first impedance unit of the at least one first power noise to heat converter absorbs the at least one power noise within at least one specific frequency band again.

3. The power noise suppression circuit according to claim 1, wherein the at least one first power noise to heat converter and the at least one anti-power noise transmitted unit can withstand a large DC current provided by the power system for an operating load circuit such that a DC power of the power system can pass through the at least one first power noise to heat converter and the at least one anti-power noise transmitted unit with a low energy loss.

4. The power noise suppression circuit according to claim 1, wherein the power noise suppression circuit is placed in a low-impedance power system, and a characteristic impedance of such low-impedance power system is below 20 ohm.

5. The power noise suppression circuit according to claim 1, wherein the power noise suppression circuit which is measured under a specific low-impedance environment below 50 ohm has an absorption rate above 50% for the at least one power noise within the at least one specific frequency band.

6. The power noise suppression circuit according to claim 1, wherein the power noise suppression circuit comprises a plurality of the first power noise to heat converters and a plurality of the anti-power noise transmitted units, each of the plurality of first power noise to heat converters absorbs the at least one power noise within the same or the different specific frequency bands, respectively, and each of plurality of the anti-power noise transmitted units reflects the at least one power noise within the same or the different specific frequency bands, respectively.

7. The power noise suppression circuit according to claim 1, wherein the power noise suppression circuit further comprises at least one second power noise to heat converter; the at least one anti-power noise transmitted unit is configured between the at least one first power noise to heat converter and the at least one second power noise to heat converter, and the at least one second power noise to heat converter comprises at least one second impedance unit; when the at least one power noise within the at least one specific frequency band enters the power noise suppression circuit, the at least one first power noise to heat converter or the at least one second power noise to heat converter absorbs the at least one power noise within the at least one specific frequency band by the at least one first impedance unit or the at least one second impedance unit so as to convert the at least one power noise within the at least one specific frequency band to the thermal energy, and the at least one anti-power noise transmitted unit reflects the at least one power noise within the at least one specific frequency band to the at least one first power noise to heat converter or the at least one second power noise to heat converter.

8. The power noise suppression circuit according to claim 7, wherein the power noise suppression circuit comprises a plurality of the first power noise to heat converters, a plurality of the anti-power noise transmitted units, and a plurality of the second power noise to heat converters, each of the first power noise to heat converters and each of the second power noise to heat converters absorb the at least one power noise within the same or the different specific frequency bands, respectively, and each of the anti-power noise transmitted units reflects the power noise with the same or the different specific frequency bands, respectively.

9. The power noise suppression circuit according to claim 7, wherein a structure of the power noise suppression circuit comprises:
   a first conductor connected to a power conductor, wherein a DC current transmitted on the power conductor flows through the first conductor; the first conductor comprises a first slot portion, a second slot portion, and a third slot portion; the first slot portion is provided at one side of the first conductor, the third slot portion is provided at other side of the first conductor, and the second slot portion is provided between the first slot portion and the third slot portion; the first slot portion comprises a first metal block that is connected to the first conductor via the at least one first impedance unit, the second slot portion comprises a second metal block that is directly connected to the first conductor, and the third slot portion is connected to the first conductor via the at least one second impedance unit; and
   a second conductor connected to a return path, wherein a return current transmitted on the return path flows through the second conductor; a gap exists between the first conductor and the second conductor;
   wherein the first slot portion, the first metal block, the at least one first impedance unit, part of the first conductor around the first slot portion, and part of the second conductor corresponding to part of the first conductor around the first slot portion is combined into the first power noise to heat converter; the second slot portion, the second metal block, part of the first conductor around the second slot portion, and part of the second conductor corresponding to part of the first conductor around the second slot portion will be combined into the anti-power noise transmitted unit; the third slot portion, the third metal block, the at least one second impedance unit, part of the first conductor around the third slot portion, and part of the second conductor corresponding to part of the first conductor around the third slot portion is combined into the second power noise to heat converter.

10. The power noise suppression circuit according to claim 7, wherein a structure of the power noise suppression circuit comprises:
    a first conductor connected to a return path, wherein a return current transmitted on the return path flows through the first conductor; the first conductor comprises a first slot portion, a second slot portion, and a third slot portion; the first slot portion is provided at one side of the first conductor, the third slot portion is provided at other side of the first conductor, and the second slot portion is provided between the first slot portion and the third slot portion; the first slot portion comprises a first metal block that is connected to the first conductor via the at least one first impedance unit, the second slot portion comprises a second metal block that is directly connected to the first conductor, and the third slot portion is connected to the first conductor via the at least one second impedance unit; and
    a second conductor connected to a power conductor, wherein a DC current transmitted on the power conductor flows through the second conductor; a gap exists between the first conductor and the second conductor;
    wherein the first slot portion, the first metal block, the at least one first impedance unit, part of the first conductor around the first slot portion, and part of the second conductor corresponding to part of the first conductor around the first slot portion is combined into the first power noise to heat converter; the second slot portion, the second metal block, part of the first conductor around the second slot portion, and part of the second conductor corresponding to part of the first conductor around the second slot portion is combined into the anti-power noise transmitted unit; the third slot portion, the third metal block, the at least one second impedance unit, part of the first conductor around the third slot portion, and part of the second conductor corresponding to part of the first conductor around the third slot portion is combined into the second power noise to heat converter.

11. The power noise suppression circuit according to claim 7, wherein a structure of the power noise suppression circuit comprises:
    a first conductor connected to a power conductor, wherein a DC current transmitted on the power conductor flows through the first conductor;
    a second conductor, connected to a return path, and comprising a first slot portion and a second slot portion; wherein a return current transmitted on the return path flows through the second conductor; a gap exists between the first conductor and the second conductor;
    a first metal pad, wherein there is a gap between the first metal pad and the first conductor;
    a third conductor extended between the first metal pad and the first slot portion of the second conductor in a vertical direction or a horizontal direction, wherein the third conductor is connected at one end thereof to the first metal pad, and connected at other end thereof to the second conductor via the at least one first impedance unit;
    a second metal pad, wherein there is a gap between the second metal pad and the first conductor, and the second metal pad is connected to the second conductor via a fourth conductor that is disposed in the vertical direction or the horizontal direction;

a third metal pad, wherein there is a gap between the third metal pad and the first conductor; and the first metal pad and the third metal pad are located on two sides of the second metal pad; and a fifth conductor extended between the third metal pad and the second slot portion of the second conductor in the vertical direction or the horizontal direction, wherein the fifth conductor is connected at one end thereof to the third metal pad, and connected at other end thereof to the second conductor via the at least one second impedance unit;

wherein the first metal pad, the third conductor, the at least one first impedance unit, part of the second conductor around the first slot portion, and part of the first conductor corresponding to part of the second conductor around the first slot portion is combined into the first power noise to heat converter; the second metal pad, the fourth conductor, part of the first conductor corresponding to the second metal pad, and part of the second conductor corresponding to the second metal pad is combined into the anti-power noise transmitted unit; the third metal pad, the fifth conductor, the at least one second impedance unit, part of the second conductor around the second slot portion, and part of the first conductor corresponding to part of the second conductor around the second slot portion will be combined into the second power noise to heat converter.

12. The power noise suppression circuit according to claim 7, wherein a structure of the power noise suppression circuit comprises:

a first conductor connected to a return path, wherein a return current transmitted on the return path flows through the first conductor;

a second conductor, connected to a power conductor, and comprising a first slot portion and a second slot portion; wherein a DC current transmitted on the power conductor flows through the second conductor; a gap exists between the first conductor and the second conductor;

a first metal pad, wherein there is a gap between the first metal pad and the first conductor;

a third conductor extended between the first metal pad and the first slot portion of the second conductor in a vertical direction or a horizontal direction, wherein the third conductor is connected at one end thereof to the first metal pad, and connected at other end thereof to the second conductor via the at least one first impedance unit;

a second metal pad, wherein there is a gap between the second metal pad and the first conductor, and the second metal pad is connected to the second conductor via a fourth conductor that is disposed in the vertical direction or the horizontal direction;

a third metal pad, wherein there is a gap between the third metal pad and the first conductor; and the first metal pad and the third metal pad are located on two sides of the second metal pad; and a fifth conductor extended between the third metal pad and the second slot portion of the second conductor in the vertical direction or the horizontal direction, wherein the fifth conductor is connected at one end thereof to the third metal pad, and connected at other end thereof to the second conductor via the at least one second impedance unit;

wherein the first metal pad, the third conductor, the at least one first impedance unit, part of the second conductor around the first slot portion, and part of the first conductor corresponding to part of the second conductor around the first slot portion is combined into the first power noise to heat converter; the second metal pad, the fourth conductor, part of the first conductor corresponding to the second metal pad, and part of the second conductor corresponding to the second metal pad is combined into the anti-power noise transmitted unit; the third metal pad, the fifth conductor, the at least one second impedance unit, part of the second conductor around the second slot portion, and part of the first conductor corresponding to part of the second conductor around the second slot portion will be combined into the second power noise to heat converter.

13. The power noise suppression circuit according to claim 1, wherein the first power noise to heat converter comprises a first conductor connected to a power conductor, and a second conductor connected to a return path; a first equivalent circuit is equivalently formed between the first conductor and the second conductor of the first power noise to heat converter; the first equivalent circuit comprises at least one first capacitor, at least one first inductor, and at least one first resistor; the at least one first capacitor, the at least one first inductor, and the at least one first resistor are connected in series or in parallel.

14. The power noise suppression circuit according to claim 1, wherein the anti-power noise transmitted unit comprises a first conductor connected to a power conductor, and a second conductor connected to a return path; a second equivalent circuit is equivalently formed between the first conductor and the second conductor of the anti-power noise transmitted unit; the second equivalent circuit comprises at least one second capacitor and at least one second inductor; the at least one second capacitor and the at least one second inductor are connected in series or in parallel.

15. The power noise suppression circuit according to claim 1, wherein a structure of the power noise suppression circuit comprises:

a first conductor connected to a power conductor, wherein a DC current transmitted on the power conductor flows through the first conductor;

a second conductor, connected to a return path, and comprising a first slot portion; wherein a return current transmitted on the return path flows through the second conductor; a gap exists between the first conductor and the second conductor;

a first metal pad, wherein there is a gap between the first metal pad and the first conductor;

a third conductor extended between the first metal pad and the first slot portion of the second conductor in a vertical direction or a horizontal direction, wherein the third conductor is connected at one end thereof to the first metal pad, and connected at other end thereof to the second conductor via the at least one first impedance unit; and a second metal pad, wherein there is a gap between the second metal pad and the first conductor, and the second metal pad is connected to the second conductor via a fourth conductor that is disposed in the vertical direction or the horizontal direction;

wherein the first metal pad, the third conductor, the at least one first impedance unit, part of the second conductor around the first slot portion, and part of the first conductor corresponding to part of the second conductor around the first slot portion is combined into the first power noise to heat converter; the second metal pad, the fourth conductor, part of the first conductor corresponding to the second metal pad, and part of the second conductor corresponding to the second metal pad is combined into the anti-power noise transmitted unit.

16. The power noise suppression circuit according to claim 1, wherein a structure of the power noise suppression circuit comprises:
a first conductor connected to a return path, wherein a return current transmitted on the return path flows through the first conductor;
a second conductor, connected to a power conductor, and comprising a first slot portion; wherein a DC current transmitted on the power conductor flows through the second conductor; a gap exists between the first conductor and the second conductor;
a first metal pad, wherein there is a gap between the first metal pad and the first conductor;
a third conductor extended between the first metal pad and the first slot portion of the second conductor in a vertical direction or a horizontal direction, wherein the third conductor is connected at one end thereof to the first metal pad, and connected at other end thereof to the second conductor via the at least one first impedance unit; and
a second metal pad, wherein there is a gap between the second metal pad and the first conductor, and the second metal pad is connected to the second conductor via a fourth conductor that is disposed in the vertical direction or the horizontal direction;
wherein the first metal pad, the third conductor, the at least one first impedance unit, part of the second conductor around the first slot portion, and part of the first conductor corresponding to part of the second conductor around the first slot portion is combined into the first power noise to heat converter; the second metal pad, the fourth conductor, part of the first conductor corresponding to the second metal pad, and part of the second conductor corresponding to the second metal pad is combined into the anti-power noise transmitted unit.

17. The power noise suppression circuit according to claim 1, wherein a structure of the power noise suppression circuit comprises:
a first conductor connected to a power conductor, wherein a DC current transmitted on the power conductor flows through the first conductor; the first conductor is provided at one side thereof with a first slot portion, and provided at other side thereof with a second slot portion; the first slot portion comprises a first metal block that is connected to the first conductor via the at least one first impedance unit, and the second slot portion comprises a second metal block that is directly connected to the first conductor; and
a second conductor connected to a return path, wherein a return current transmitted on the return path flows through the second conductor; a gap exists between the first conductor and the second conductor;
wherein the first slot portion, the first metal block, the at least one first impedance unit, part of the first conductor around the first slot portion, and part of the second conductor corresponding to part of the first conductor around the first slot portion is combined into the first power noise to heat converter; the second slot portion, the second metal block, part of the first conductor around the second slot portion, and part of the second conductor corresponding to part of the first conductor around the second slot portion is combined into the anti-power noise transmitted unit.

18. The power noise suppression circuit according to claim 1, wherein a structure of the power noise suppression circuit comprises:
a first conductor connected to a return path, wherein a return current transmitted on the return path flows through the first conductor; the first conductor is provided at one side thereof with a first slot portion, and provided at other side thereof with a second slot portion; the first slot portion comprises a first metal block that is connected to the first conductor via the at least one first impedance unit, and the second slot portion comprises a second metal block that is directly connected to the first conductor; and
a second conductor connected to a power conductor, wherein a DC current transmitted on the power conductor flows through the second conductor; a gap exists between the first conductor and the second conductor;
wherein the first slot portion, the first metal block, the at least one first impedance unit, part of the first conductor around the first slot portion, and part of the second conductor corresponding to part of the first conductor around the first slot portion is combined into the first power noise to heat converter; the second slot portion, the second metal block, part of the first conductor around the second slot portion, and part of the second conductor corresponding to part of the first conductor around the second slot portion is combined into the anti-power noise transmitted unit.

* * * * *